US 12,087,884 B2

(12) United States Patent
Do et al.

(10) Patent No.: US 12,087,884 B2
(45) Date of Patent: Sep. 10, 2024

(54) LIGHT-EMITTING DEVICE AND DISPLAY DEVICE COMPRISING UNIFORMLY DISTRIBUTED LIGHT EMITTING ELEMENTS

(71) Applicant: SAMSUNG DISPLAY CO., LTD., Yongin-Si (KR)

(72) Inventors: Young Rag Do, Seoul (KR); Yun Jae Eo, Seoul (KR)

(73) Assignee: Samsung Display Co., Ltd., Yongin-si (KR)

(*) Notice: Subject to any disclaimer, the term of this patent is extended or adjusted under 35 U.S.C. 154(b) by 428 days.

(21) Appl. No.: 17/423,089

(22) PCT Filed: Jul. 15, 2019

(86) PCT No.: PCT/KR2019/008733
§ 371 (c)(1),
(2) Date: Jul. 14, 2021

(87) PCT Pub. No.: WO2020/149476
PCT Pub. Date: Jul. 23, 2020

(65) Prior Publication Data
US 2022/0085249 A1 Mar. 17, 2022

(30) Foreign Application Priority Data
Jan. 15, 2019 (KR) .................. 10-2019-0005454

(51) Int. Cl.
H01L 33/38 (2010.01)
H01L 27/15 (2006.01)
(Continued)

(52) U.S. Cl.
CPC .......... H01L 33/387 (2013.01); H01L 27/156 (2013.01); H01L 33/20 (2013.01); H01L 33/62 (2013.01)

(58) Field of Classification Search
CPC ..... H01L 33/387; H01L 27/156; H01L 33/20; H01L 33/62; H01L 25/0753; H01L 25/167; H01L 33/38; H01L 33/16
(Continued)

(56) References Cited

U.S. PATENT DOCUMENTS 5,670,797 A 9/1997 Okazaki
5,814,837 A 9/1998 Okazaki
(Continued)

FOREIGN PATENT DOCUMENTS

CN 105789236 A 7/2016
CN 107611153 A 1/2018
(Continued)

OTHER PUBLICATIONS

International Search Report for corresponding Application No. PCT/KR2019/008733 dated Oct. 23, 2019, 4pp.

Primary Examiner — Kimberly N Rizkallah
Assistant Examiner — Pratiksha Jayant Lohakare
(74) Attorney, Agent, or Firm — Lewis Roca Rothgerber Christie LLP

(57) ABSTRACT

A light emitting device includes a substrate. First and second electrodes are on the substrate and spaced from each other. A first insulating layer is on the substrate and the first and second electrodes, and includes openings to partially expose opposing portions of the first and second electrodes adjacent an area between the first and second electrodes. At least one light emitting element is located in the opening. A first end of the at least one light emitting element is connected to a first portion of the first electrode exposed by the opening, and a second end of the at least one light emitting element is connected to a second portion of the second electrode exposed by the opening.

20 Claims, 18 Drawing Sheets

(51) Int. Cl.
*H01L 33/20* (2010.01)
*H01L 33/62* (2010.01)

(58) Field of Classification Search
USPC .......................................................... 257/79
See application file for complete search history.

(56) References Cited

U.S. PATENT DOCUMENTS

| | | | |
|---|---|---|---|
| 5,882,949 A * | 3/1999 | Okazaki | H01L 33/486 |
| | | | 438/22 |
| 8,097,896 B2 | 1/2012 | Kim et al. | |
| 8,354,664 B2 * | 1/2013 | Moon | H01L 33/20 |
| | | | 257/79 |
| 8,556,488 B2 | 10/2013 | Lee | |
| 8,748,898 B2 * | 6/2014 | Yamazaki | H01L 21/3003 |
| | | | 257/443 |
| 9,048,409 B2 | 6/2015 | Seo et al. | |
| 9,329,433 B2 * | 5/2016 | Negishi | H01L 24/95 |
| 10,205,051 B2 | 2/2019 | Kim et al. | |
| 10,211,418 B2 | 2/2019 | Im et al. | |
| 10,340,419 B2 | 7/2019 | Kim et al. | |
| 10,461,123 B2 | 10/2019 | Kim et al. | |
| 10,672,946 B2 | 6/2020 | Cho et al. | |
| 10,784,246 B2 | 9/2020 | Do et al. | |

| | | | |
|---|---|---|---|
| 2015/0155444 A1 * | 6/2015 | Chen | H01L 33/382 |
| | | | 257/79 |
| 2016/0148911 A1 * | 5/2016 | Do | H05K 1/0295 |
| | | | 438/28 |
| 2017/0352784 A1 * | 12/2017 | Seong | H01L 33/382 |
| 2018/0019426 A1 | 1/2018 | Im et al. | |
| 2019/0019878 A1 * | 1/2019 | Yen | H01L 33/36 |
| 2019/0123235 A1 * | 4/2019 | Cho | H01L 33/24 |
| 2021/0288104 A1 * | 9/2021 | Yang | H01L 25/0753 |

FOREIGN PATENT DOCUMENTS

| | | |
|---|---|---|
| CN | 107623013 A | 1/2018 |
| CN | 107634081 A | 1/2018 |
| EP | 3270424 A1 | 1/2018 |
| JP | 08-213660 A | 8/1996 |
| JP | 2012-004535 A | 1/2012 |
| KR | 10-2008-0057876 A | 6/2008 |
| KR | 10-2009-0002193 A | 1/2009 |
| KR | 10-0955319 B1 | 4/2010 |
| KR | 10-2017-0091805 A | 8/2017 |
| KR | 10-2018-0072909 A | 7/2018 |
| KR | 10-2018-0081378 A | 7/2018 |
| KR | 10-2018-0082667 A | 7/2018 |
| KR | 10-2020-0088959 A | 7/2020 |
| KR | 10-2020-0088960 A | 7/2020 |
| KR | 10-2020-0088962 A | 7/2020 |

\* cited by examiner

FIG. 5A
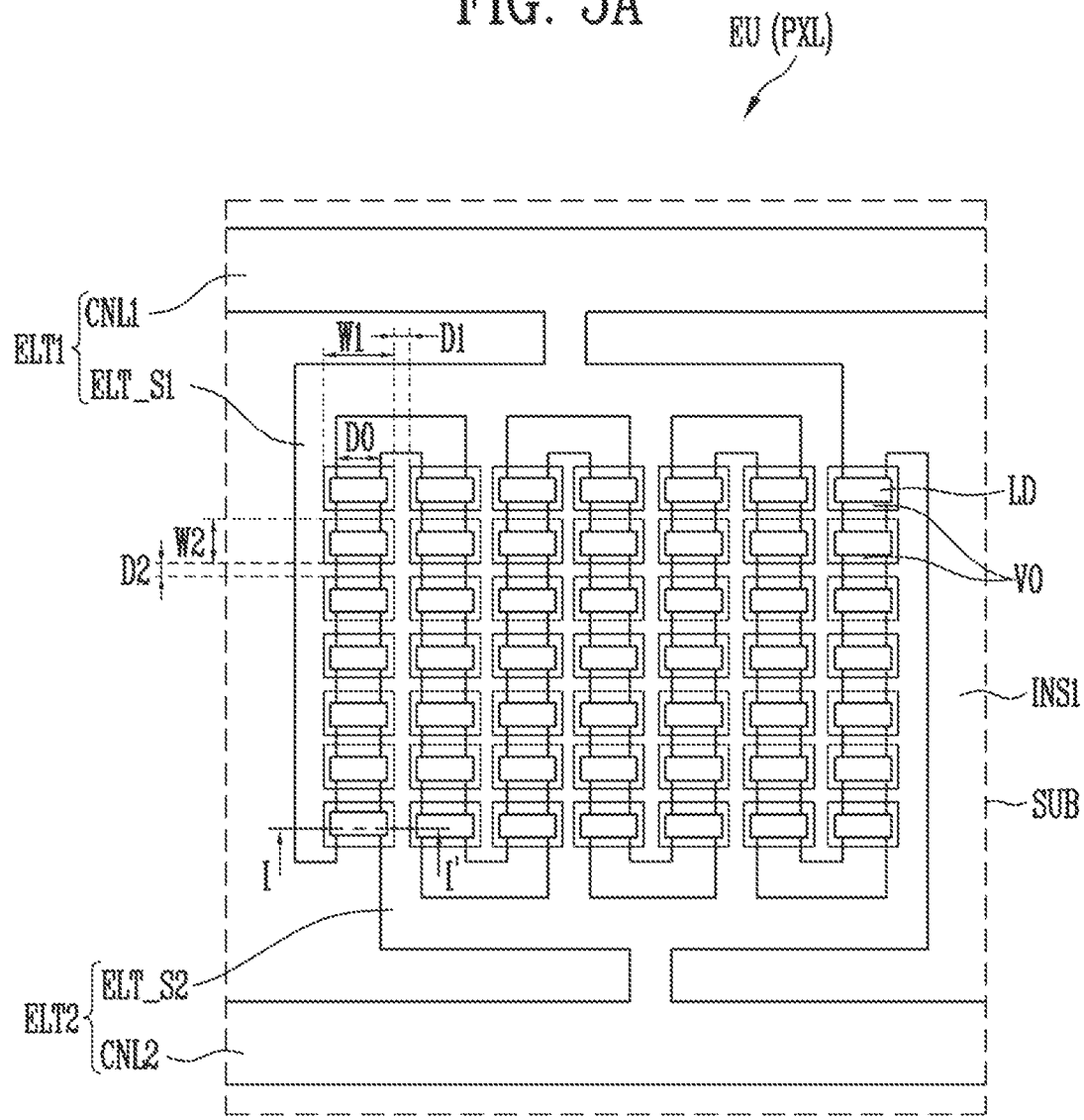
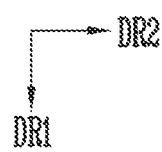

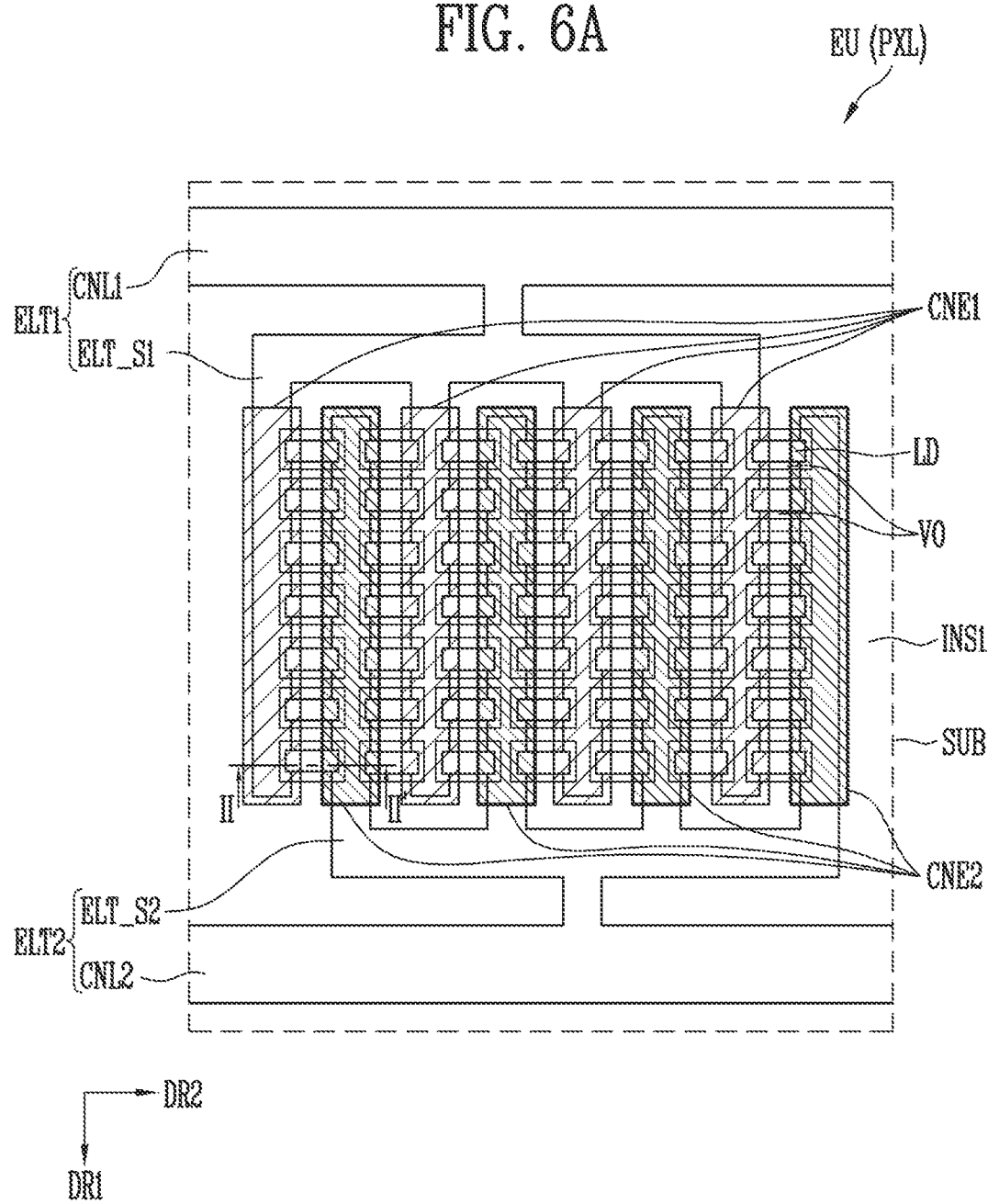

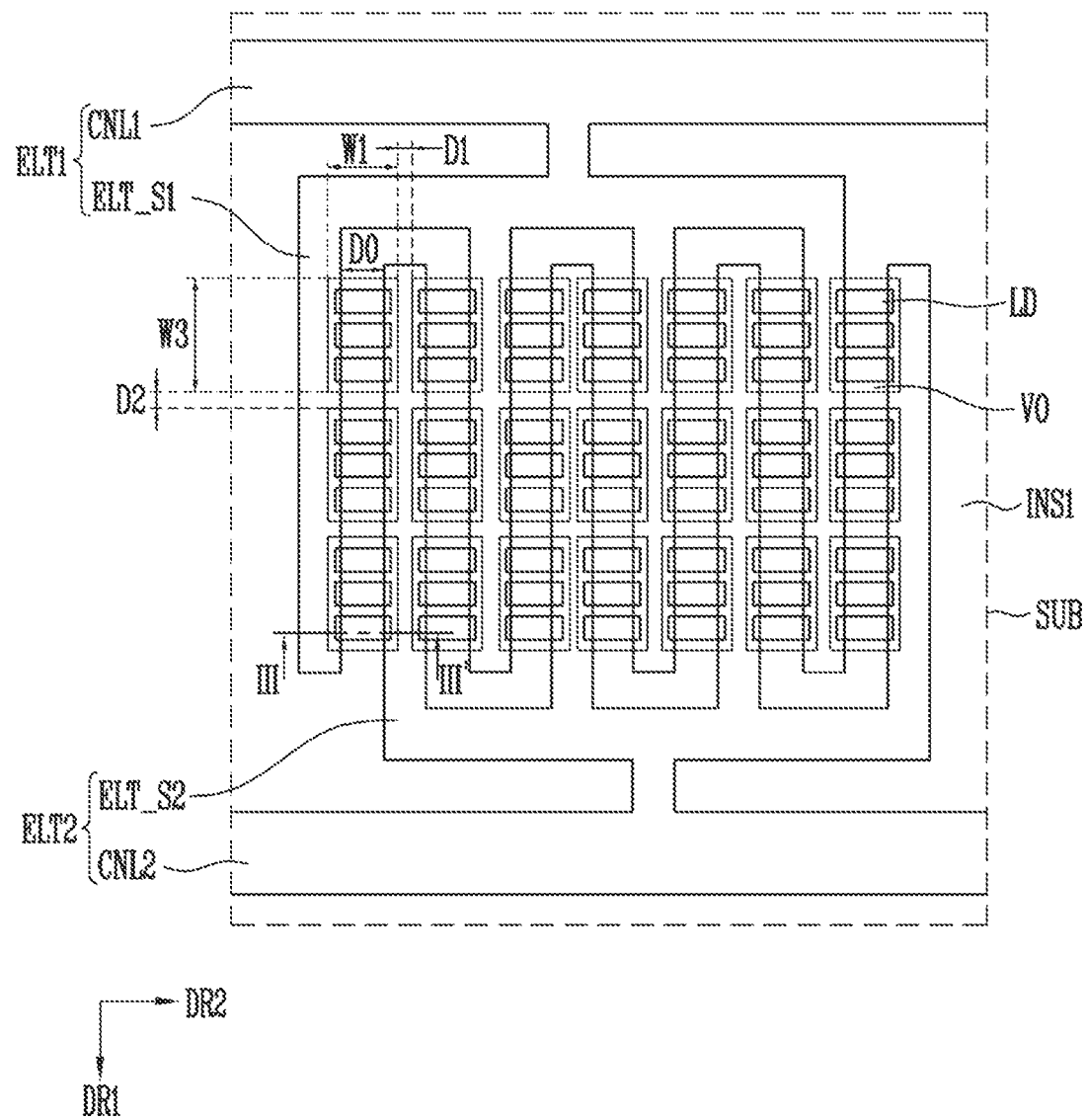

FIG. 7B
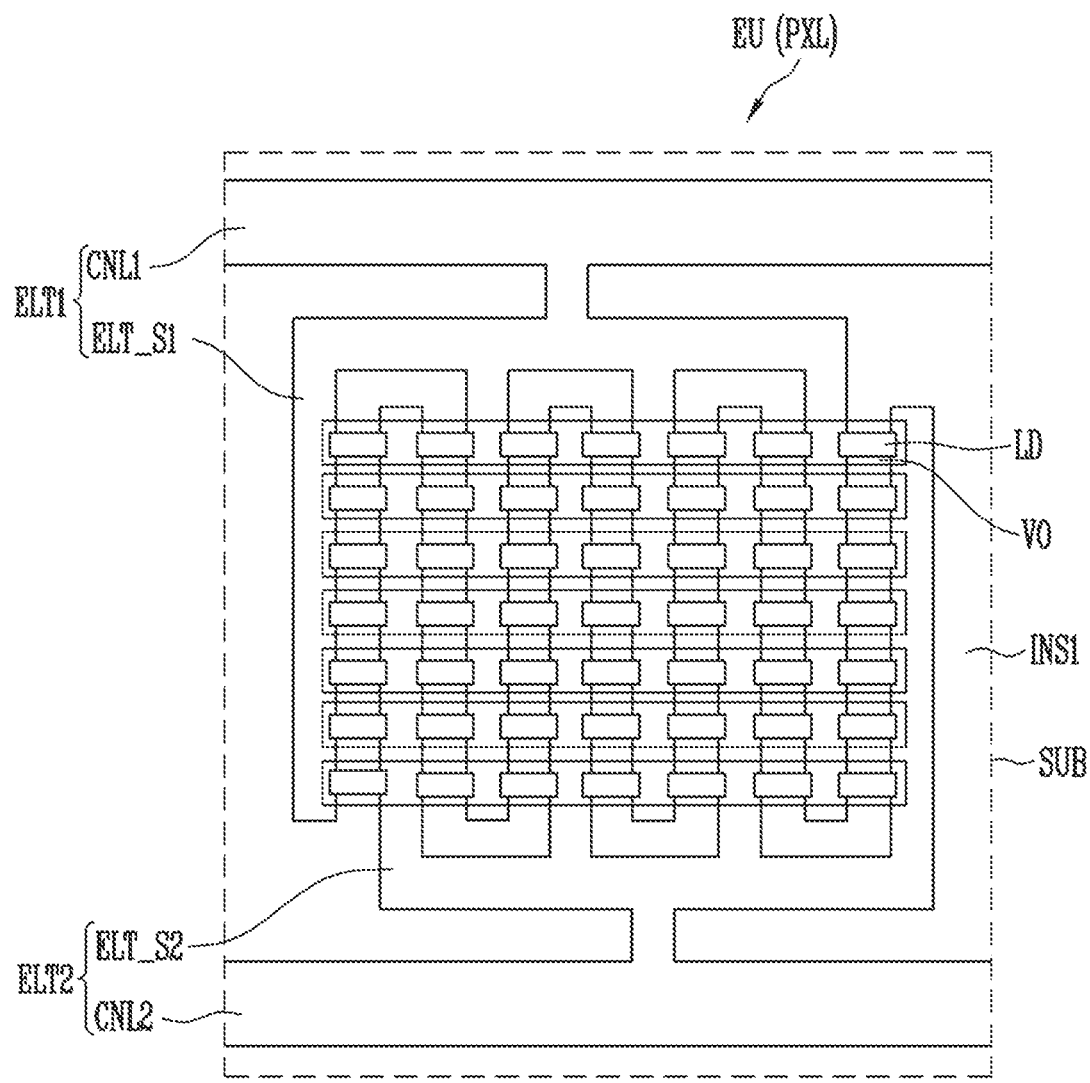
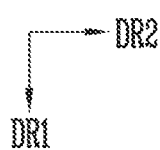

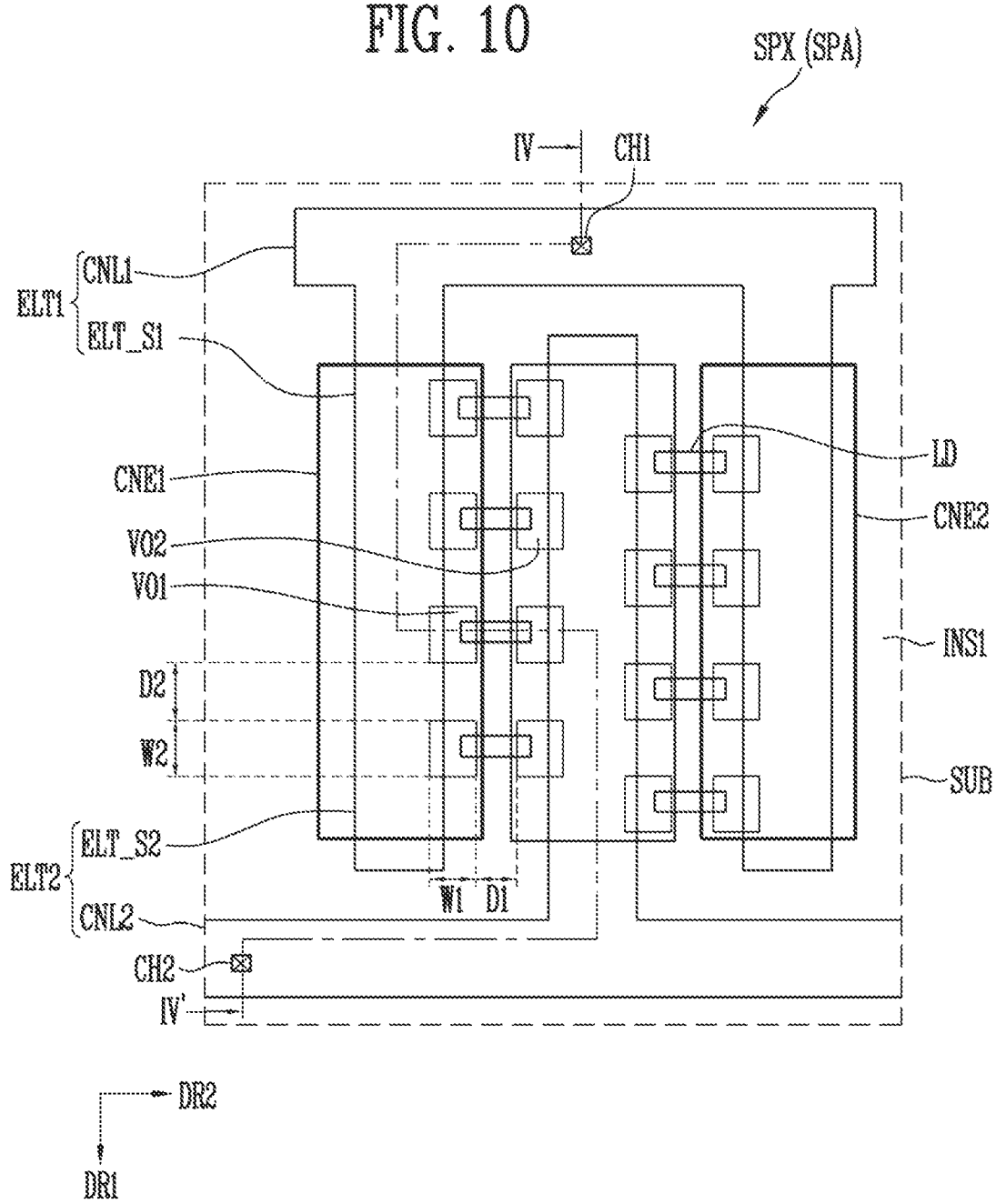

LIGHT-EMITTING DEVICE AND DISPLAY DEVICE COMPRISING UNIFORMLY DISTRIBUTED LIGHT EMITTING ELEMENTS

CROSS-REFERENCE TO RELATED APPLICATIONS

This application is a U.S. National Phase patent application of International Patent Application Number PCT/KR2019/008733, filed on Jul. 15, 2019, which claims priority to Korean Patent Application Number 10-2019-0005454, filed on Jan. 15, 2019, the entire content of both of which are incorporated herein by reference.

BACKGROUND

1. Field

Various embodiments of the present disclosure relate to a light emitting device and a display device including the light emitting device.

2. Related Art

Recently, the technique of manufacturing a subminiature light emitting element using a material having a reliable inorganic crystal structure and manufacturing alight emitting device using the light emitting element has been developed. For example, a technique of forming a light source of the light emitting device using subminiature light emitting elements having a small size corresponding to a range from a nanometer scale to a micrometer scale has been developed. Such a light emitting device may be used in various electronic devices such as a display device and alighting device.

SUMMARY

Subminiature light emitting elements are prepared in the form of being sprayed in solution and supplied to a substrate of a light emitting device. Some of the subminiature light emitting elements may be aligned and connected between adjacent electrodes due to an electric field formed between the electrodes on the substrate.

As the number of the subminiature light emitting elements disposed between the electrodes increases, the emission efficiency (or light extraction efficiency) of the light emitting device may be improved. Furthermore, when the subminiature light emitting elements are uniformly disposed between the electrodes, the light emitting elements may emit light uniformly, so that the emission quality of the light emitting device may be improved.

An aspect of one or more embodiments of the present disclosure is to provide alight emitting device and a display device that uniformly emit light with improved emission efficiency.

According to an aspect of embodiments of the present disclosure, a light emitting device may include a substrate; a first electrode and a second electrode on the substrate and spaced from each other; a first insulating layer on the substrate and the first and second electrodes, and including openings to partially expose opposing portions of the first and second electrodes adjacent an area between the first and second electrodes; and at least one light emitting element located in the opening, wherein a first end of the at least one light emitting element may be connected to a first portion of the first electrode exposed by the opening, and a second end of the at least one light emitting element may be connected to a second portion of the second electrode exposed by the opening.

The light emitting element may be a rod-type light emitting diode having a size ranging from a nanometer scale to a micrometer scale.

Each of the openings may be a rod-type slit having a size ranging from a nanometer scale to a micrometer scale.

A first length in a major-axis direction of the opening may be greater than an average length in a major-axis direction of the at least one light emitting element by 5% to 30%.

A second length in a minor-axis direction of the opening may be greater than an average diameter of the at least one light emitting element by 10% to 100%.

Each of the first and second electrodes may extend in a first direction, and the openings may be repetitively arranged between the first and second electrodes and spaced from each other in the first direction.

The light emitting device may further include a first contact electrode overlapping the first end of the at least one light emitting element and the first electrode, and connecting the first end to the first electrode; and a second contact electrode overlapping the second end of the at least one light emitting element and the second electrode, and connecting the second end to the second electrode.

The first electrode and the second electrode may be located at a same layer, and the first contact electrode and the second contact electrode may be located at a same layer.

A distance between the first and second electrodes in the opening may be smaller than an average length in a major-axis direction of the at least one light emitting element, the first end of the at least one light emitting element may overlap the first electrode, and the second end of the at least one light emitting element may overlap the second electrode.

Each of the first and second electrodes may extend in a first direction, and a length of the opening in the first direction may be smaller than the average length of the light emitting element.

Each of the first and second electrodes may extend in a first direction, the opening may extend in a second direction substantially perpendicular to the first direction, and the opening may cross the first and second electrodes.

According to an aspect of embodiments the present disclosure, a display device may include a substrate; a first electrode and a second electrode on the substrate and spaced from each other; a first insulating layer on the substrate and the first and second electrodes, and including a first opening that partially exposes a side of the first electrode, and a second opening that partially exposes a side of the second electrode that is opposite to the side of the first electrode; and at least one light emitting element between the first and second electrodes overlapping the first opening and the second opening, wherein a first end of the at least one light emitting element may be connected to a first portion of the first electrode exposed by the first opening, and a second end of the at least one light emitting element may be connected to a second portion of the second electrode exposed by the second opening.

The at least one light emitting element may be a rod-type light emitting diode having a size ranging from a nanometer scale to a micrometer scale.

Each of the first and second openings may be a slit having a size ranging from a nanometer scale to a micrometer scale.

A distance between the sides of the first and second electrodes in the first and second openings may be greater than an average length in a major-axis direction of the at least one light emitting element, and the at least one light emitting element between the first and second electrodes may be located on the first insulating layer.

The at least one light emitting element may be located in a space defined by the first and second openings.

Each of the first and second electrodes may extend in a first direction, and a first length of each of the first and second openings in the first direction may be greater than an average diameter of the at least one light emitting element by 10% to 100%.

A second length of each of the first and second openings in a second direction may be smaller than an average length in the major-axis direction of the at least one light emitting element, and the second direction may be substantially perpendicular to the first direction.

The display device may further include a first contact electrode overlapping the first end of the at least one light emitting element and the first electrode, and connecting the first end to the first electrode through the first opening; and a second contact electrode overlapping the second end of the at least one light emitting element and the second electrode, and connecting the second end to the second electrode through the second opening.

The display device may further include a first bank pattern between the substrate and the first electrode, and a second bank pattern between the substrate and the second electrode.

In a light emitting device and a display device in accordance with an embodiment of the present disclosure, because light emitting elements are disposed respectively in rod-type openings (or slits) provided in an insulating layer disposed on electrodes, the number of the light emitting elements disposed between the electrodes may be increased. Therefore, the emission efficiency of the light emitting device and the display device can be improved.

Furthermore, because the openings are uniformly distributed between the electrodes, the light emitting elements can be uniformly distributed. Therefore, the light emitting device and the display device can emit light uniformly.

BRIEF DESCRIPTION OF THE DRAWINGS

FIG. 5A is a plan view illustrating an example of the light emitting device of FIG. 4.

FIG. 6A is a plan view illustrating an example of the light emitting device of FIG. 4.

FIGS. 7A and 7B are plan views illustrating an example of the light emitting device of FIG. 4.

FIG. 10 is a plan view illustrating an example of a sub-pixel included in the display device of FIG. 8.

DETAILED DESCRIPTION

Figure 1A:
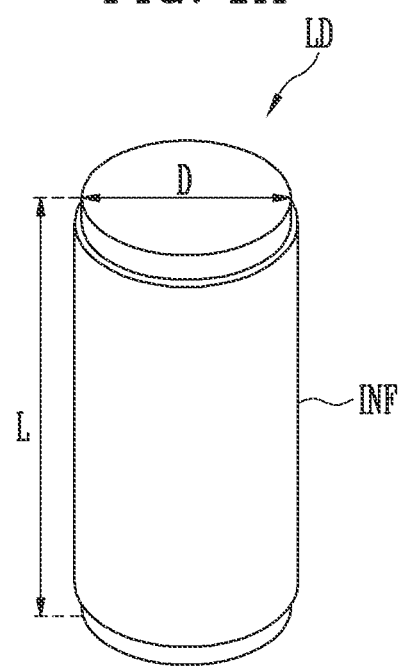
FIGS. 1A and 1B are a perspective view and a sectional view illustrating a light emitting element in accordance with an embodiment of the present disclosure.

Reference will now be made in detail to various embodiments of the present disclosure, examples of which are illustrated in the accompanying drawings and described below, because the embodiments of the present disclosure can be variously modified in many different forms. However, the present disclosure is not limited to the following embodiments and may be modified into various forms.

Some elements which are not directly related to the features of embodiments of the present disclosure in the drawings may be omitted to clearly explain the present disclosure. Furthermore, the sizes, ratios, etc. of some elements in the drawings may be slightly exaggerated. It should be noted that the same reference numerals are used to designate the same or similar elements throughout the drawings, and repetitive explanation will be omitted.

It will be understood that, although the terms "first", "second", etc. may be used herein to describe various elements, these elements should not be limited by these terms. It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof. Furthermore, when a first part such as a layer, a film, an area, or a plate is disposed on a second part, the first part may be not only directly on the second part but a third part may intervene between them. Furthermore, the term "position", "direction", etc. used in the following description are defined in relative terms, and it should be noted that they may be changed into a reverse position or direction depending on a view angle or direction.

Embodiments and details thereof of the present disclosure are described with reference to the accompanying drawings in order to describe the present disclosure in detail so that those having ordinary skill in the technical field to which the present disclosure pertains can practice the present disclosure. Furthermore, a singular form may include a plural from as long as the singular form clearly does not include a plural form from the context of the passage.

Figure 1B:
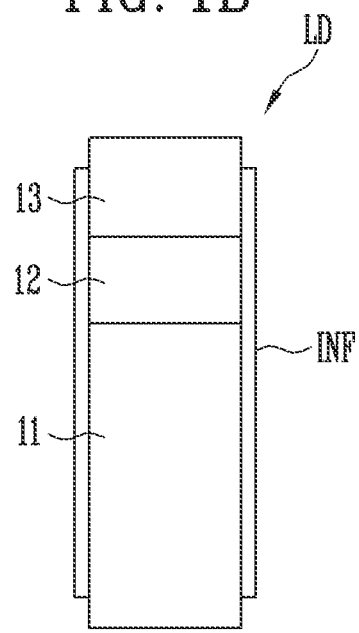

FIGS. 1A and 1B are a perspective view and a sectional view illustrating a light emitting element in accordance with an embodiment of the present disclosure. Although a rod-type light emitting element LD of a cylindrical shape is illustrated in FIGS. 1A and 1B, the type and/or shape of the light emitting element LD according to the present disclosure are not limited thereto.

Referring to FIGS. 1A and 1B, the light emitting element LD may include a first conductive semiconductor layer 11, a second conductive semiconductor layer 13, and an active layer 12 interposed between the first and second conductive semiconductor layers 11 and 13. For example, the light emitting element LD may be configured of a stacked body formed by successively stacking the first conductive semiconductor layer 11, the active layer 12, and the second conductive semiconductor layer 13 in one direction.

In an embodiment, the light emitting element LD may be provided in the form of a rod extending in one direction. The light emitting element LD may have a first end and a second end in one direction.

In an embodiment, one of the first and second conductive semiconductor layers 11 and 13 may be disposed on the first end of the light emitting element LD, and the other one of the first and second conductive semiconductor layers 11 and 13 may be disposed on the second end of the light emitting element LD.

In an embodiment, the light emitting element LD may be a rod-type light emitting diode manufactured in the form of a rod. Here, the term "rod-like shape" embraces a rod-like shape and a bar-like shape such as a cylindrical shape and a prismatic shape whose longitudinal direction is longer than a width direction (i.e., to have an aspect ratio greater than 1), and the cross-sectional shape thereof is not limited to a particular shape. For example, a length L of the light emitting element LD may be greater than a diameter D thereof (or a width of the cross-section thereof).

In an embodiment, the light emitting element LD may have a small size corresponding to a range from a nanometer scale to a micrometer scale, e.g., a diameter D and/or a length L corresponding to a range from a nanometer scale to a micrometer scale. However, the size of the light emitting element LD is not limited to this. For example, the size of the light emitting element LD may be changed in various ways depending on design conditions of various devices, e.g., a display device, which employs, as a light source, a light emitting device using the light emitting element LD.

The first conductive semiconductor layer 11 may include at least one n-type semiconductor layer. For instance, the first conductive semiconductor layer 11 may include one semiconductor material of InAlGaN, GaN, AlGaN, InGaN, AlN, and InN, and may be doped with a first conductive dopant such as Si, Ge, or Sn. However, the material forming the first conductive semiconductor layer 11 is not limited to this, and the first conductive semiconductor layer 11 may be formed of various other materials. The thickness of the first conductive semiconductor layer 11 may range from 500 nm to 5 μm, but is not limited thereto.

The active layer 12 may be disposed on the first conductive semiconductor layer 11 and have a single or multiple quantum well structure. In an embodiment, a cladding layer doped with a conductive dopant may be formed above and/or under the active layer 12. For example, the cladding layer may be formed of an AlGaN layer or an InAlGaN layer. In an embodiment, a material such as AlGaN or AlInGaN may be used to form the active layer 12, and various other materials may be used to form the active layer 12.

If an electric field of a suitable voltage (e.g., a set or predetermined voltage) or more is applied between the opposite ends of the light emitting element LD, the light emitting element LD may emit light by recombination of electron-hole pairs in the active layer 12. Because light emission of the light emitting element LD can be controlled based on the foregoing principle, the light emitting element LD may be used as a light source of various light emitting devices as well as a pixel of the display device. The thickness of the active layer 12 may range from 10 nm to 200 nm, but is not limited thereto.

The second conductive semiconductor layer 13 may be disposed on the active layer 12 and include a semiconductor layer of a type different from that of the first conductive semiconductor layer 11. For example, the second conductive semiconductor layer 13 may include at least one p-type semiconductor layer. For instance, the second conductive semiconductor layer 13 may include at least one semiconductor material of InAlGaN, GaN, AlGaN, InGaN, AlN, and InN, and may be doped with a second conductive dopant such as Mg. However, the material forming the second conductive semiconductor layer 13 is not limited to this, and the second conductive semiconductor layer 13 may be formed of various other materials. The thickness of the second conductive semiconductor layer 13 may range from 50 nm to 500 nm, but is not limited thereto.

In an embodiment, the light emitting element LD may further include an insulating film INF provided on the surface (e.g., an outer circumferential surface or an outer surface) of the light emitting element LD. The insulating film INF may be formed on the surface of the light emitting element LD to enclose an outer surface (e.g., an outer circumferential surface or an outer peripheral surface) of at least the active layer 12. In addition, the insulating film INF may further enclose an area of each of the first and second conductive semiconductor layers 11 and 13. The insulating film INF may allow the opposite ends of the light emitting element LD that have different polarities to be exposed to the outside. For example, the insulating film INF may expose one end of each of the first and second conductive semiconductor layers 11 and 13 that are disposed on the respective opposite ends of the light emitting element LD with respect to the longitudinal direction, e.g., may expose two planes (i.e. top and bottom surfaces) of the cylinder rather than covering them.

In an embodiment, the insulating film INF may include at least one insulating material of $SiO_2$, $Si_3N_4$, $Al_2O_3$, and $TiO_2$, but it is not limited thereto. In other words, the material forming the insulating film INF is not limited to a particular material, and the insulating film INF may be formed of well-known various insulating materials.

In an embodiment, the light emitting element LD may further include additional other components as well as the first conductive semiconductor layer 11, the active layer 12, the second conductive semiconductor layer 13, and the insulating film INF. For example, the light emitting element LD may further include at least one fluorescent layer, at least one active layer, at least one semiconductor layer and/or at least one electrode layer disposed on one end of the first conductive semiconductor layer 11, the active layer 12, and/or the second conductive semiconductor layer 13.

Figure 2A:
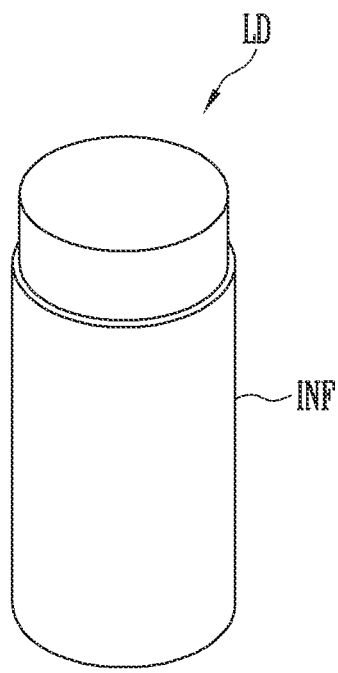
FIGS. 2A and 2B are a perspective view and a sectional view illustrating a light emitting element in accordance with an embodiment of the present disclosure.
Figure 2B:
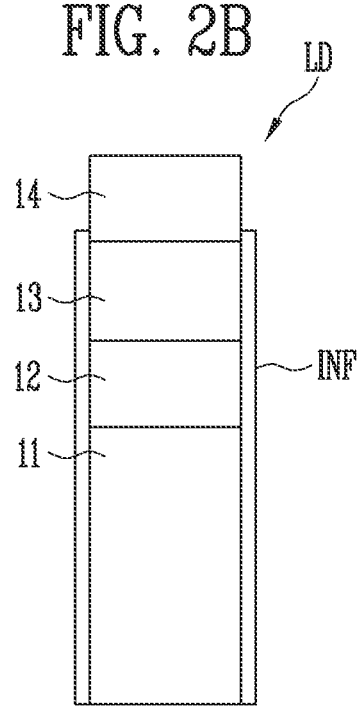
Figure 3A:
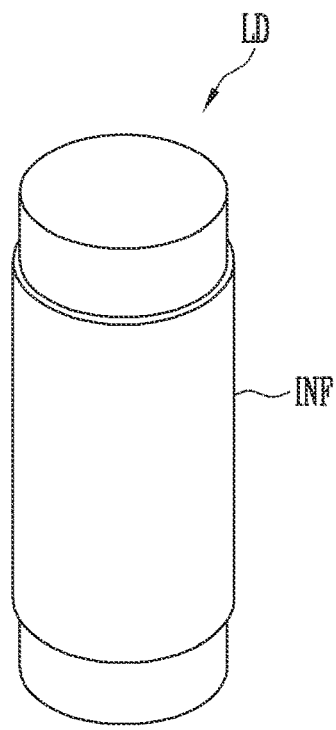
FIGS. 3A and 3B are a perspective view and a sectional view illustrating a light emitting element in accordance with an embodiment of the present disclosure.
Figure 3B:
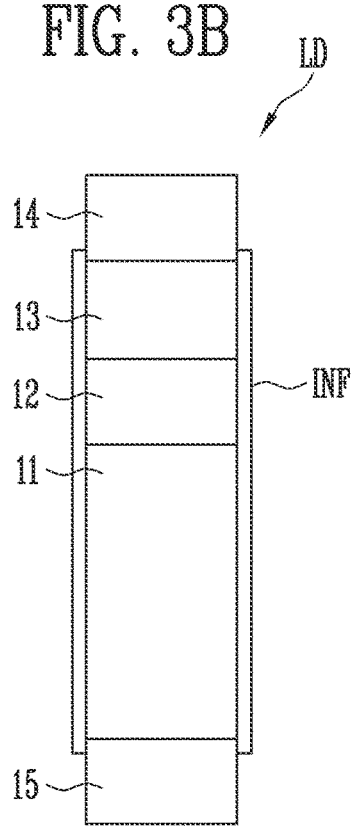

FIGS. 2A and 2B are a perspective view and a sectional view illustrating a light emitting element in accordance with an embodiment of the present disclosure. FIGS. 3A and 3B are a perspective view and a sectional view illustrating a light emitting element in accordance with an embodiment of the present disclosure.

Referring to FIGS. 2A and 2B, the light emitting element LD may further include at least one electrode layer 14 disposed on one end of the second conductive semiconductor layer 13.

Referring to FIGS. 3A and 3B, the light emitting element LD may further include at least one different electrode layer 15 disposed on one end of the first conductive semiconductor layer 11.

Each of the electrode layers 14 and 15 may be an ohmic contact electrode, but it is not limited thereto. Furthermore, each of the electrode layers 14 and 15 may include metal or conductive metal oxide. For example, each of the electrode layers 14 and 15 may be formed of chromium (Cr), titanium (Ti), aluminum (Al), gold (Au), nickel (Ni), or oxides or alloys thereof, indium tin oxide (ITO), indium zinc oxide (IZO), indium tin zinc oxide (ITZO), alone or in combination. The electrode layers 14 and 15 may be substantially transparent or translucent. Thereby, light generated from the light emitting element LD may be emitted to the outside of the light emitting element LD after passing through the electrode layers 14 and 15. The thickness of each of the electrode layers 14 and 15 may range from 1 nm to 200 nm, but is not limited thereto.

In an embodiment, the insulating film INF may at least partially enclose the outer surfaces (e.g., outer circumferential surfaces or outer peripheral surfaces) of the electrode layers 14 and 15, or may not enclose them. In other words, the insulating film INF may be selectively formed on the surfaces of the electrode layers 14 and 15. Furthermore, the insulating film INF may be formed to expose the opposite ends of the light emitting element LD that have different polarities, and may expose at least an area of each of the electrode layers 14 and 15, for example. However, without being limited thereto, the insulating film INF may not be provided.

Because the insulating film INF is provided on the surface (e.g., an outer circumferential surface or an outer peripheral surface) of the light emitting element LD, for example, on the surface of the active layer 12, the active layer 12 may be prevented from short-circuiting with at least one electrode, e.g., at least one contact electrode of contact electrodes coupled to the opposite ends of the light emitting element LD, etc. Consequently, the electrical stability of the light emitting element LD may be secured.

Furthermore, the insulating film INF may be formed on the surface (e.g., an outer circumferential surface or an outer peripheral surface) of the light emitting element LD, thus reducing or minimizing surface defects of the light emitting element LD and improving the lifespan and efficiency of the light emitting element LD. Moreover, the insulating film INF is formed on the light emitting element LD, thus preventing an unwanted short circuit between the adjacent light emitting elements LD, even if multiple light emitting elements LD are arranged in close proximity to each other.

In an embodiment, the light emitting element LD may be manufactured through a surface treatment process (e.g. coating). For example, when the plurality of light emitting elements LD is mixed with fluid solution to be supplied to each light emitting area (e.g. light emitting area of each pixel), the light emitting elements LD may be uniformly dispersed without being aggregated in the solution. Here, the light emitting area is an area in which light is emitted by the light emitting elements LD. The light emitting area may be distinguished from a non-light-emitting area in which light is not emitted.

A light emitting device including the light emitting element LD may be used in various types of devices including a display device that requires a light source. For example, a plurality of subminiature light emitting elements LD may be disposed in each pixel area of the display panel, thereby forming an emission unit of each pixel. Furthermore, the field of application of the light emitting element LD according to the present disclosure is not limited to the display device. For example, the light emitting element LD may also be used in various types of devices such as a lighting device, which requires a light source.

Figure 4:
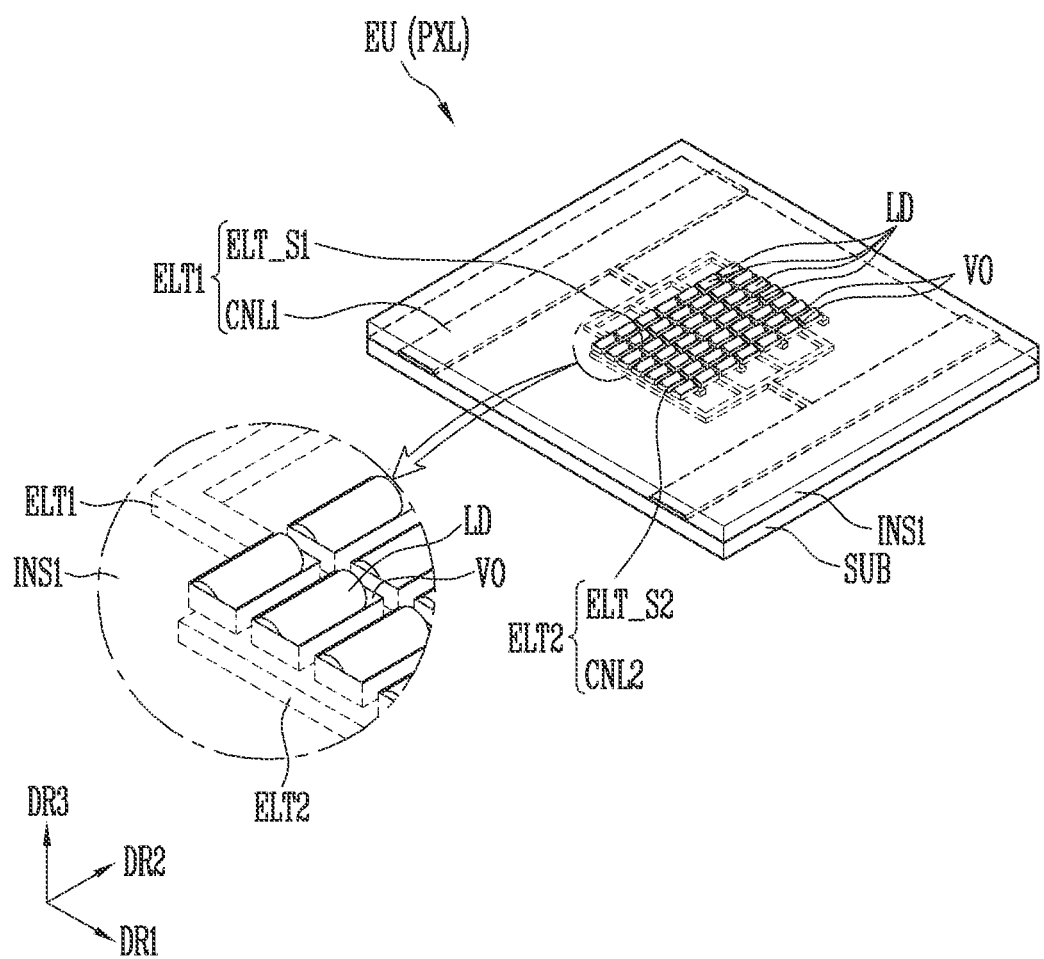
FIG. 4 is a perspective view illustrating a light emitting device in accordance with an embodiment of the present disclosure.

FIG. 4 is a perspective view illustrating a light emitting device in accordance with an embodiment of the present disclosure. FIG. 4 illustrates a light emitting device EU as an example of a device that may use the light emitting elements LD described in FIGS. 1A-3B as a light source. Furthermore, FIG. 4 schematically illustrates the light emitting device EU, focused on a unit emission area (or pixel PXL) of the light emitting device EU. Here, the unit emission area may be a unit area in which light is emitted, and may be, for example, an area in which luminance and/or color of the emitted light may be independently adjusted.

Figure 5B:
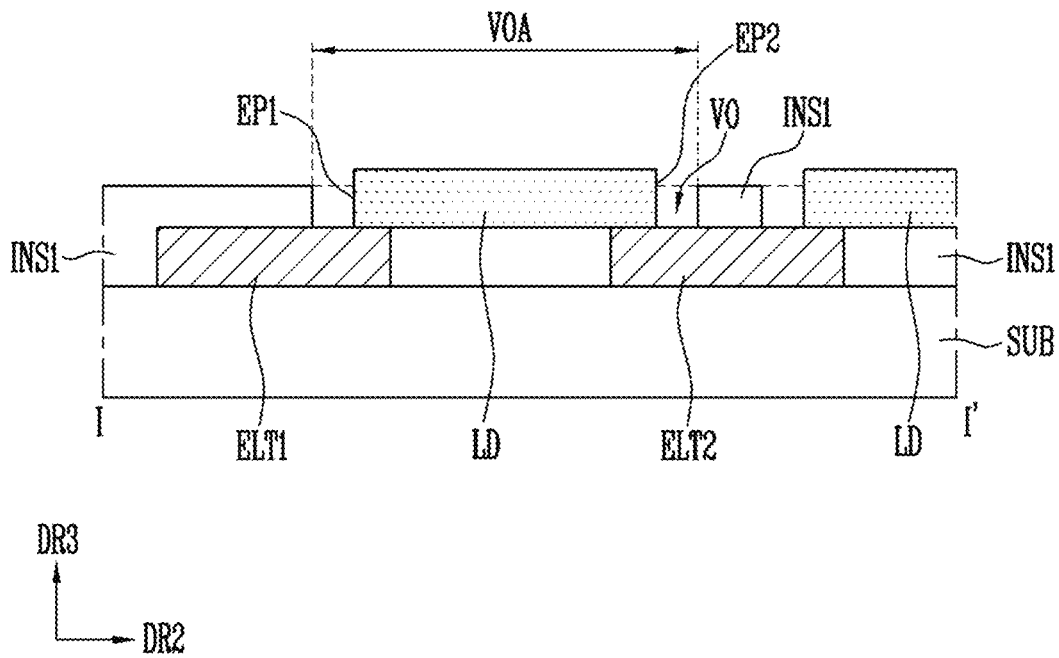
FIG. 5B is a sectional view illustrating an example of the light emitting device of FIG. 5A taken along the line I-I' of FIG. 5A.

FIG. 5A is a plan view illustrating an example of the light emitting device of FIG. 4. FIG. 5B is a sectional view illustrating an example of the light emitting device of FIG. 5A taken along the line I-I' of FIG. 5A.

Referring to FIGS. 4, 5A, and 5B, the light emitting device EU may include a substrate SUB, a first electrode ELT1, a second electrode ELT2, a first insulating layer INS1, and light emitting elements LD.

The substrate SUB may form a base member of the light emitting device EU.

In an embodiment, the substrate SUB may be a rigid or flexible substrate, and the material or properties thereof are not particularly limited. For example, the substrate SUB may be a rigid substrate made of glass or reinforced glass, or a flexible substrate formed of a thin film made of plastic or metal. Furthermore, the substrate SUB may be a transparent substrate, but it is not limited thereto. For instance, the substrate SUB may be a translucent substrate, an opaque substrate, or a reflective substrate.

The area and shape of the substrate SUB are not limited, and may be changed in consideration of the areas of the first and second electrodes ELT1 and ELT2 that are to be formed on the substrate SUB, the size of the light emitting elements LD, and the number of mounting, etc. The thickness of the substrate SUB may range from 100 μm to 1 mm. The area (or unit electrode area) of each of the first and second electrodes ELT1 and ELT2 may range from about 10 μm 2 to 100 cm$^2$.

The first and second electrodes ELT1 and ELT2 may be disposed on the substrate SUB.

The first electrode ELT1 and the second electrode ELT2 may be disposed in the unit emission area to be spaced from each other, and may be disposed such that at least portions thereof face (or opposite) each other.

According to some embodiments, the first electrode ELT1 may include at least one first sub-electrode ELT_S1 (hereinafter, referred to as a first sub-electrode ELT_S1), and the second electrode ELT2 may include at least one second sub-electrode ELT_S2 (hereinafter, referred to as a second sub-electrode ELT_S2). Each of the first sub-electrode ELT_S1 and the second sub-electrode ELT_S2 may extend in a first direction DR1 in the pixel PXL, and may be arranged side by side to be spaced along a second direction DR2.

For example, as shown in FIGS. 4 and 5A-5B, the first electrode ELT1 may include four first sub-electrodes ELT_S1, and the second electrode ELT2 may include four second sub-electrodes ELT_S2. The first sub-electrode ELT_S1 and the second sub-electrode ELT_S2 may be alternately disposed along the second direction DR2 while having a space or an interval (e.g., a set or predetermined distance) therebetween. However, the present disclosure is not limited thereto. For example, each of the first and second electrodes ELT1 and ELT2 may include three or less, or five or more sub-electrodes. As another example, the first electrode ELT1 may include two first sub-electrodes ELT_S1, and the second electrode ELT2 may include one second sub-electrode ELT_S2 (see FIG. 10). In other words, the shape and/or arrangement relation of the first and second sub-electrodes ELT_S1 and ELT_S2 (or the first and second electrodes ELT1 and ELT2) may be variously changed.

According to an embodiment, a separation distance D0 between the first sub-electrode ELT_S1 and the second sub-electrode ELT_S2 (or a gap, a separation distance between the first electrode ELT1 and the second electrode ELT2) may be equal to or less than the length L (see FIG. 1A) (or the average length) of each of the light emitting elements LD, but the present disclosure is not limited thereto.

The line width and thickness of each of the first and second electrodes ELT1 and ELT2 may vary depending on the applied voltage. For example, the line width of each of the first and second electrodes ELT1 and ELT2 may range from 100 nm to 50 μm, and the thickness of each of the first and second electrodes ELT1 and ELT2 may range from 0.1 μm to 10 μm.

In an embodiment, the first electrode ELT1 may further include a first connection electrode CNL1 connected to the first sub-electrode ELT_S1. For example, the first connection electrode CNL1 may extend in the second direction DR2, and may be integrally connected to the first sub-electrode ELT_S1. For example, the first sub-electrode ELT_S1 may be formed of at least one branch diverging from the first connection electrode CNL1. In the case where the first sub-electrode ELT_S1 and the first connection electrode CNL1 are integrated with each other, the first connection electrode CNL1 may be regarded as an area of the first electrode ELT1. However, the present disclosure is not limited thereto. For example, in another embodiment of the present disclosure, the first sub-electrode ELT_S1 and the first connection electrode CNL1 may be separately formed from each other and electrically coupled to each other through at least one contact hole or via hole. The first connection electrode CNL1 may be independently disposed for each unit emission area, and may be electrically separated from the first connection electrode of another unit emission area. However, the present disclosure is not limited thereto.

In an embodiment, the first sub-electrode ELT_S1 and the first connection electrode CNL1 may extend in different directions in the unit emission area. For example, when the first connection electrode CNL1 extends in the second direction DR2, the first sub-electrode ELT_S1 may extend in the first direction DR1 intersecting the second direction DR2.

Likewise, the second electrode ELT2 may further include a second connection electrode CNL2 connected to the second sub-electrode ELT_S2. Because the arrangement of the second connection electrode CNL2 and the connection relation with the second sub-electrode ELT_S2 are substantially the same as the arrangement of the first connection electrode CNL1 and the connection relation with the first sub-electrode ELT_S1, repetitive explanation thereof will be omitted. The second connection electrode CNL2 may extend from a corresponding unit emission area to other unit emission area.

The second sub-electrode ELT_S2 and the second connection electrode CNL2 may extend in different directions in the unit emission area. For example, when the second connection electrode CNL2 extends in the second direction DR2, the second sub-electrode ELT_S2 may extend in the first direction DR1 intersecting the second direction DR2.

Each of the first and second electrodes ELT1 and ELT2 may include at least one conductive material. For example, each of the first and second electrodes ELT1 and ELT2 may include at least one of metal such as Ag, Mg, Al, Pt, Pd, Au, Ni, Nd, Ir, Cr, Ti or an alloy thereof, conductive oxide such as ITO, IZO, ZnO, or ITZO, and a conductive polymer such as PEDOT; however, it is not limited thereto.

Furthermore, each of the first and second electrodes ELT1 and ELT2 may have a single-layer structure or a multi-layer structure. For example, each of the first and second electrodes ELT1 and ELT2 may include at least one reflective electrode layer. Furthermore, each of the first and second electrodes ELT1 and ELT2 may selectively further include at least one of at least one transparent electrode layer disposed above and/or under the reflective electrode layer, and at least one conductive encapsulation layer covering an upper portion of the reflective electrode layer and/or the transparent electrode layer.

According to an embodiment, the reflective electrode layer of each of the first and second electrodes ELT1 and ELT2 may be formed of a conductive material having uniform reflectivity. For example, the reflective electrode layer may include at least one of metals such as Ag, Mg, Al, Pt, Pd, Au, Ni, Nd, Ir, Cr, and an alloy thereof; however, the present disclosure is not limited thereto. In other words, the reflective electrode layer may be formed of various reflective conductive materials. When the first and second electrodes ELT1 and ELT2 each include a reflective electrode layer, this makes it possible for light emitted from the opposite ends, i.e., the first and second ends EP1 and EP2, of each light emitting element LD to propagate in a third direction DR3.

Furthermore, the transparent electrode layer of each of the first and second electrodes ELT1 and ELT2 may be formed of various transparent electrode materials. By way of example, the transparent electrode layer may include ITO, IZO or ITZO, but the present disclosure is not limited thereto. In an embodiment, each of the first and second electrodes ELT1 and ELT2 may have a three-layer structure having a stacked structure of ITO/Ag/ITO. As such, if the first and second electrodes ELT1 and ELT2 each have a multi-layer structure of at least two layers, voltage drop due to signal delay (RC delay) may be reduced or minimized. Thus, a desired voltage may be effectively transmitted to the light emitting elements LD.

According to an embodiment, if each of the first and second electrodes ELT1 and ELT2 includes the conductive encapsulation layer covering the reflective electrode layer and/or the transparent electrode layer, it is possible to prevent the reflective electrode layer of the first and second electrodes ELT1 and ELT2 from being damaged due to defects caused by the manufacturing process of the pixel PXL. However, the conductive encapsulation layer may be selectively included in the first and second electrodes ELT1 and ELT2, and may be omitted according to an embodiment. Furthermore, the conductive encapsulation layer may be considered as a component of each of the first and second electrodes ELT1 and ELT2, or considered as a separate component disposed on the first and second electrodes ELT1 and ELT2.

The first insulating layer INS1 may be disposed on the substrate SUB and the first and second electrodes ELT1 and ELT2. For example, the first insulating layer INS1 may cover at least a portion of the first and second electrodes ELT1 and ELT2, or may be entirely disposed on the substrate SUB.

The first insulating layer INS1 may have a single-layer structure or a multi-layer structure, and may include at least one inorganic insulating material and/or organic insulating material. For example, each first insulating layer INS1 may include various types of currently known organic/inorganic insulating materials, including SiNx. For instance, the first insulating layer INS1 may be formed of at least one material selected from the group consisting of silicon nitride, silicon oxide, zirconium oxide, hafnium oxide, aluminum oxide, and titanium oxide. However, the present disclosure is not limited thereto, and a material forming the first insulating layer INS1 is not particularly limited.

In some embodiments, the first insulating layer INS1 may include an opening VO (or slit, through hole). The opening VO may penetrate the first insulating layer INS1, and between the first and second electrodes ELT1 and ELT2, may partially expose facing portions (or opposing portions) of the first and second electrodes ELT1 and ELT2 that face (or are opposite) each other. For example, a first end of the opening VO may expose a portion of the first electrode ELT1, and a second end of the opening VO may expose a portion of the second electrode ELT2 facing (or opposite) the first electrode ELT1. The opening VO may be formed through photolithography and etching processes.

In some embodiments, the opening VO may be a rod-type slit having a size ranging from a nanometer scale to a micrometer scale. For example, the opening VO may have the shape of a rectangular plane that is long in the second direction DR2 and is relatively short in the first direction DR1. However, this is only an example, and the shape of the opening VO is not limited thereto.

In an embodiment, the openings VO may be arranged in the first insulating layer INS1 in a matrix form. In other words, the first insulating layer INS1 including the openings VO may have a mesh structure. For example, the openings VO are located between the first and second electrodes ELT1 and ELT2 on a plane, the openings VO in the first insulating layer INS1 may be repetitively formed with a first interval D1 (or first distance D1) along the second direction DR2, and the openings VO may be repetitively formed with a second interval D2 (or second distance D2) along the first direction DR1. Here, the first interval D1 may be determined by a first length W1 (or the average length in the major-axis direction of the light emitting elements LD) in the major-axis direction (i.e. the second direction DR2) of the opening VO, and the average line width of the first and second electrodes ELT1 and ELT2. For example, the first interval D1 may be 50% or less, or 30% or less of the first length W1 (or, the average length of the light emitting elements LD in the major-axis direction) in the major-axis direction of the opening VO. In this case, the light emitting elements LD may not be disposed in the first insulating layer INS1 between the first and second electrodes ELT1 and ELT2, and may be easily mounted in the opening VO. The second interval D2 may be determined by the second length W2 (or the average diameter of the light emitting elements LD) in the minor-axis direction (i.e. the first direction DR1) of the opening VO and the desired number of mounting the light emitting elements LD. For example, the second interval D2 may be smaller than the second length W2 (or, the average diameter of the light emitting elements LD) in the minor-axis direction of the opening VO. Men the second interval D2 is smaller than the second length W2 in the minor-axis direction of the opening VO, the light emitting elements LD may not be disposed in the first insulating layer INS1 between the first and second electrodes ELT1 and ELT2, and may be easily mounted in the opening VO.

In other words, the major axis of the opening VO may be disposed to be orthogonal to the first and second electrodes ELT1 and ELT2 each having a line shape, and opposite ends of the opening VO in the major-axis direction may be disposed on the first electrode ELT1 and the second electrode ELT2.

In an embodiment, the first length W1 of the opening VO in the major-axis direction may be greater than the average length (e.g. the length L shown in FIG. 1A) of the light emitting elements LD in the major-axis direction by 5% to 30%. When the first length W1 of the opening VO is 5% or more of the average length of the light emitting elements LD, the light emitting elements LD may be easily mounted in the opening VO. When the first length W1 of the opening VO is 30% or less of the average length of the light emitting elements LD, one light emitting element LD may be mounted in the opening VO in the second direction DR2 to be connected to the first and second electrodes ELT1 and ELT2.

In an embodiment, the second length W2 of the opening VO in the minor-axis direction may be greater than the average diameter (e.g. the diameter D shown in FIG. 1A) of the light emitting elements LD by 10% to 100%. When the second length W2 of the opening VO is 10% or more of the average diameter of the light emitting elements LD, the light emitting elements LD may be easily mounted in the opening VO. When the second length W2 of the opening VO is 100% or less of the average diameter of the light emitting elements LD, one light emitting element LD may be mounted in the opening VO in the first direction DR1, and the light emitting elements LD may be more uniformly distributed in the unit emission area.

The light emitting elements LD may be arranged between the first and second electrodes ELT1 and ELT2 to be disposed or mounted in the opening VO (or an opening area VOA) of the first insulating layer INS1. The light emitting elements LD may be connected in parallel through the first electrode ELT1 and the second electrode ELT2 facing (or opposite) each other.

Although FIGS. 4 and 5A illustrate that the light emitting elements LD are aligned between the first and second electrodes ELT1 and ELT2 in the second direction DR2, e.g. a horizontal direction, the direction of arranging the light emitting elements LD is not limited thereto. For example, at least one of the light emitting elements LD may be disposed in a diagonal direction on the first insulating layer INS1.

Each of the light emitting elements LD may be electrically coupled between the first and second electrodes ELT1 and ELT2. For example, a first end EP1 of each light emitting element LD may be electrically coupled to the first electrode ELT1 exposed by the opening VO, and a second end EP2 of each light emitting element LD may be electrically coupled to the second electrode ELT2 exposed by the opening VO.

According to an embodiment, the first end EP1 of each of the light emitting elements LD may overlap the first electrode ELT1, and the second end EP2 of each of the light emitting elements LD may overlap the second electrode ELT2. In other words, the first end EP1 of each of the light emitting elements LD may be directly disposed on or come into contact with the first electrode ELT1, and the second end EP2 of each of the light emitting elements LD may be directly disposed on or come into contact with the second electrode ELT2. In this case, the light emitting elements LD may be electrically coupled to the first and second electrodes ELT1 and ELT2. However, the present disclosure is not limited to this.

In an embodiment, each of the light emitting elements LD may be formed of a light emitting diode that is made of material having an inorganic crystal structure and has a subminiature size, e.g., a small size corresponding to a range from a nanometer scale to a micrometer scale. For example, each of the light emitting elements LD may be a subminiature rod-type light emitting diode having a size ranging from a nanometer scale to a micrometer scale shown in anyone of FIGS. 1A-3B. However, the type of the light emitting elements LD that may be applied to the present disclosure is not limited thereto. For example, the light emitting element LD may be formed in a growth method, and for example, may be a light emitting diode of a core-shell structure having a size ranging from a nanometer scale to a micrometer scale.

In an embodiment, the light emitting elements LD may be prepared in a diffused form in a suitable solution (e.g., a set or predetermined solution), and then supplied to the first insulating layer INS1 in the unit emission area by an inkjet printing scheme or a slit coating scheme. For example, the light emitting elements LD may be mixed with a volatile solvent and supplied to the first insulating layer INS1 in the unit emission area. Here, when a suitable voltage (e.g., a set or predetermined voltage) is supplied to the first and second electrodes ELT1 and ELT2, an electric field is formed between the first and second electrodes ELT1 and ELT2, whereby the light emitting elements LD are self-aligned between the first and second electrodes ELT1 and ELT2. As the opening VO of the first insulating layer INS1 is formed between the first and second electrodes ELT1 and ELT2, the self-aligned light emitting elements LD may be mounted in the opening VO. After the light emitting elements LD have been aligned, the solvent may be removed by a volatilization method or other methods. In this way, the light emitting elements LD may be reliably arranged between the first and second electrodes ELT1 and ELT2.

The light emitting elements LD arranged in the unit emission area may be gathered to form a light source. For instance, when a driving current flows between the first and second electrodes ELT1 and ELT2 during each frame period, the light emitting elements LD connected in a forward direction between the first and second electrodes ELT1 and ELT2 may emit light, and light having a luminance corresponding to the driving current may be emitted.

As described above with reference to FIGS. 4-5B, the opening VO exposing the facing (or opposing) first and second electrodes ELT1 and ELT2 is formed in the first insulating layer INS1, and light emitting elements LD are mounted in the opening VO, so that the number of the light emitting elements LD (or effective light emitting elements capable of normally emitting light) mounted between the first and second electrodes ELT1 and ELT2 may increase, and the contact failure of the first and second electrodes ELT1 and ELT2 of the light emitting elements LD may be prevented.

Although FIG. 5B shows that an empty space is formed between the substrate SUB and the light emitting element LD by the opening VO between the first and second electrodes ELT1 and ELT2, the present disclosure is not limited thereto. For example, depending on the shape of the opening VO, the first insulating layer INS1 or another insulating layer may be disposed between the substrate SUB and the light emitting element LD, which will be described later with reference to FIGS. 10 and 11.

Figure 5C:
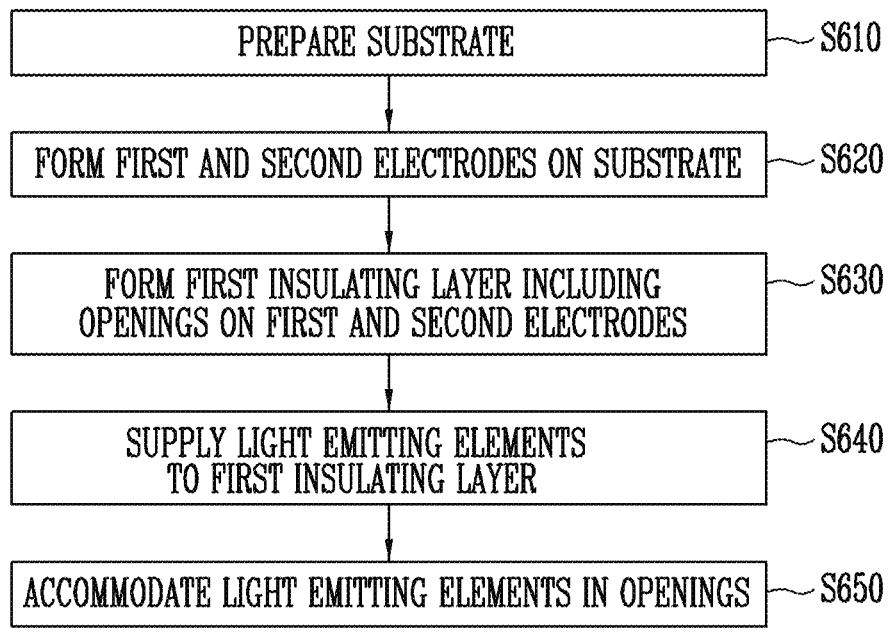
FIG. 5C is a flowchart illustrating a method of manufacturing the light emitting device of FIG. 4.

FIG. 5C is a flowchart illustrating a method of manufacturing the light emitting device of FIG. 4.

Referring to FIGS. 4-5C, the method of FIG. 5C may manufacture the light emitting device EU of FIG. 4.

First, the method of FIG. 5C may prepare the substrate SUB (S610).

The area and shape of the substrate SUB are not limited, and may be changed in consideration of the areas of the first and second electrodes ELT1 and ELT2 that are to be formed on the substrate SUB, the size of the light emitting elements LD, and the number of mounting, etc. The thickness of the substrate SUB may range from 100 μm to 1 mm. The area (or unit electrode area) of each of the first and second electrodes ELT1 and ELT2 may range from about 10 $\mu m^2$ to 100 $cm^2$.

Subsequently, the method of FIG. 5C may form the first and second electrodes ELT1 and ELT2 on the substrate SUB (S620).

As the method of forming the first and second electrodes ELT1 and ELT2, any method may be used without limitation as long as it is usually possible to form an electrode. For example, in the method of FIG. 5C, a photo resist layer may be formed by coating a photo resist (PR) on the substrate SUB. Here, the photo resist may be a commonly used photo resist. The method of forming the photo resist layer by coating the photo resist on the substrate SUB may be any one of spin coating, spray coating, and screen printing. The thickness of the photo resist layer may range from 0.1 μm to 10 μm. However, the thickness of the photo resist layer may be changed in consideration of the thickness of the electrodes ELT1 and ELT2 to be deposited on the substrate SUB.

After forming the photo resist layer on the substrate SUB, a mask on which patterns corresponding to the first electrode ELT1 and the second electrode ELT2 are drawn at the same plane may be placed on the photo resist layer, and UV rays may be exposed on the top of the mask. A step of immersing the exposed photo resist layer in a general photo resist solvent to remove the photo resist layer may be performed, so that a portion of the exposed photo resist layer in which an electrode line is to be formed may be removed.

Subsequently, an electrode forming material may be deposited in the shape of an electrode line on a portion from which the photo resist layer has been removed. The electrode forming material may be a material forming the first and second electrodes ELT1 and ELT2, and may be any one or more metal materials selected from a group consisting of aluminum, titanium, indium, gold, and silver, or any one or more transparent materials selected from a group consisting of ITO (Indium Tin Oxide), ZnO:Al, and CNT conductive polymer composites. When two or more types of electrode forming materials are used, the first and second electrodes ELT1 and ELT2 may have a structure in which two or more types of materials are stacked.

The electrode forming material may be deposited by anyone of a thermal deposition method, an e-beam deposition method, a sputtering deposition method, and a screen printing method, and preferably, the thermal deposition method, but is not limited thereto.

After the electrode forming material is deposited to form the first and second electrodes ELT1 and ELT2, the photo resist layer coated on the substrate SUB is removed using a photo resist remover selected from acetone, 1-Methyl-2-pyrrolidone (NMP), dimethyl sulfoxide (DMSO) or a remover, thus manufacturing the first and second electrodes ELT1 and ELT2 deposited on the substrate SUB.

Subsequently, in the method of FIG. 5C, the first insulating layer INS1 including the openings VO may be formed on the first and second electrodes ELT1 and ELT2 (S630).

According to an embodiment, the first insulating layer INS1 may be formed by any one of plasma-enhanced chemical vapor deposition (PECVD), e-beam deposition, atomic layer deposition, and sputter deposition, but is not limited thereto.

The first insulating layer INS1 may include at least one material selected from $SiO_2$, $Si_3N_4$, SiNx, $Al_2O_3$, $HfO_2$, $Y_2O_3$, and $TiO_2$. Furthermore, the first insulating layer INS1 may have the thickness of 1 nm to 100 μm, which may vary depending on a voltage (e.g. alignment voltage) of a power supply applied to the first and second electrodes ELT1 and ELT2, the length of the light emitting elements LD, and a distance between the first and second electrodes ELT1 and ELT2.

The openings VO provided in the first insulating layer INS1 may be formed through a general method, and preferably may be formed through any one method selected from a group consisting of nano/micro imprint and photolithography, and more preferably may be formed through photolithography.

Subsequently, in the method of FIG. 5C, the light emitting elements LD may be supplied to the first insulating layer INS1 (S640), and the light emitting elements LD may be accommodated in the openings VO (S650).

The light emitting elements LD may be prepared in a form dispersed in a solution and supplied to the first insulating layer INS1. The solution may be prepared by mixing the light emitting elements LD with a dispersion solvent. The dispersion solvent may be in the form of ink or paste. The solvent which is a volatile solvent may be at least one selected from acetone, water, alcohol, and toluene. However, the type of the dispersion solvent is not limited to those mentioned above, and any solvent may be used without limitation as long as it may evaporate well without physically or chemically affecting light emitting elements LD. The solution may contain 0.001 to 100 wt % of light emitting elements LD by the weight of the dispersion solvent. When the solution contains less than 0.001 wt % of light emitting elements LD, the number of the light emitting elements LD connected to the electrodes (e.g. the first and second electrodes ELT1 and ELT2) may be small. In contrast, when the solution contains the light emitting elements LD exceeding 100 wt %, alignment between the light emitting elements LD may be disturbed.

Subsequently, if a suitable voltage (e.g., a set or predetermined voltage) is supplied to the first and second electrodes ELT1 and ELT2, an electric field is formed between the first and second electrodes ELT1 and ELT2, whereby the light emitting elements LD are self-aligned between the first and second electrodes ELT1 and ELT2 in a plan view. After the light emitting elements LD are aligned, the solvent is volatilized or removed in other manners, so that the light emitting elements LD may be reliably arranged on the first insulating layer INS1.

For example, when a first voltage is supplied to the first and second electrodes ELT1 and ELT2, an electric field is formed between the first and second electrodes ELT1 and ELT2, so that polarization may occur in the light emitting elements LD. Accordingly, the light emitting elements LD may be arranged with orientation tendency due to electrostatic attraction between adjacent electrodes. When the first electrode ELT1 is an anode and the second electrode ELT2 is a cathode, the first end EP1 of the light emitting elements LD having a negative charge may be located on the first insulating layer INS1 to correspond to the position of the first electrode ELT1, and the second end EP2 thereof having a positive charge may be located on the first insulating layer INS1 to correspond to the position of the second electrode ELT2. Because the openings VO are formed in the first insulating layer INS1 between the first and second electrodes ELT1 and ELT2, the aligned light emitting elements LD may be accommodated in the openings VO, respectively.

In some embodiments, the first voltage may have a voltage level of 0.1V to 2000V. Men the voltage level of the first voltage is less than 0.1V, the alignment efficiency of the light emitting elements LD may be reduced. When the voltage level of the first voltage exceeds 2000V, the first insulating layer INS1 may be destroyed, thus causing current leakage, an electrical short, or damage to the electrode. Furthermore, the frequency of the first voltage may range from 10 Hz to 100 GHz. For example, the first voltage may be a sine wave of 90 kHz to 100 MHz. Men the frequency is less than 10 Hz, the number of mounted light emitting elements LD may be significantly reduced, and the orientation of the light emitting elements LD may be very irregular. When the frequency exceeds 100 GHz, the light emitting elements LD may not adapt to the rapidly changing AC power, so that the mounting properties of the light emitting elements LD may be deteriorated and orientation tendency may also be reduced.

Figure 6B:
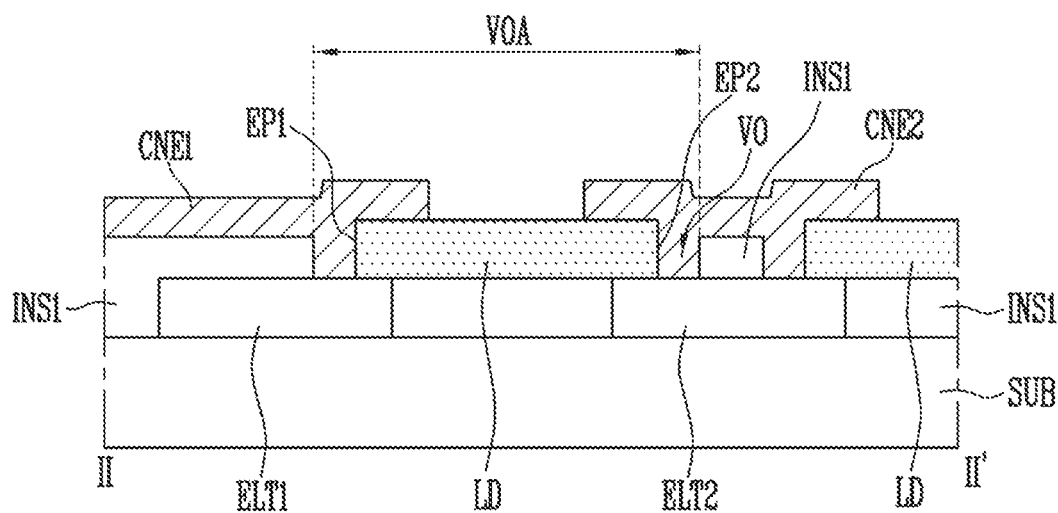
FIG. 6B is a sectional view illustrating an example of the light emitting device of FIG. 6A taken along the line II-II' of FIG. 6A.

FIG. 6A is a plan view illustrating an example of the light emitting device of FIG. 4. FIG. 6B is a sectional view illustrating an example of the light emitting device of FIG. 6A taken along the line II-II' of FIG. 6A.

Referring to FIGS. 5A, 6A, and 6B, the light emitting device EU (or the pixel PXL) of FIG. 6A is different from the light emitting device EU of FIG. 5A in that the former further includes a first contact electrode CNE1 and a second contact electrode CNE2. In other words, because the light emitting device EU of FIG. 6A is substantially equal or similar to the light emitting device EU of FIG. 5A except for the first and second contact electrodes CNE1 and CNE2, repetitive explanation thereof will be omitted.

The first contact electrode CNE1 is formed on both the first ends EP1 of the light emitting elements LD and at least a portion of the corresponding first electrode ELT1, whereby the first ends EP1 of the light emitting elements LD may be physically and/or electrically coupled to the first electrode ELT1. Likewise, the second contact electrode CNE2 is formed on both the second ends EP2 of the light emitting elements LD and at least a portion of the corresponding second electrode ELT2, whereby the second ends EP2 of the light emitting elements LD may be physically and/or electrically coupled to the second electrode ELT2.

For example, the first contact electrode CNE1 may be disposed on the first electrode ELT1 to come into contact with the first electrode ELT1. For example, after the light emitting elements LD are disposed in the opening VO on an area of the first electrode ELT1 that is not covered by the first insulating layer INS1, the first contact electrode CNE1 and the second contact electrode CNE2 may be formed on the first end EP1 and the second end EP2 of the light emitting elements LD, respectively, so that the light emitting elements LD may be reliably connected between the first and second electrodes ELT1 and ELT2.

In an embodiment, the first and second contact electrodes CNE1 and CNE2 may be disposed at the same layer as illustrated in FIG. 6B. In this case, the first and second contact electrodes CNE1 and CNE2 may be formed of the same conductive material in the same process, but the present disclosure is not limited thereto.

FIGS. 7A and 7B are plan views illustrating an example of the light emitting device of FIG. 4.

Referring to FIGS. 5A, 7A, and 7B, each of the light emitting device EU of FIG. 7A and the light emitting device EU of FIG. 7B may be substantially equal or similar to the light emitting device EU of FIG. 5A, except for the size and arrangement of the opening VO. The cross-sectional structure of the light emitting device EU of FIG. 7A may be substantially the same as the cross-sectional structure of the light emitting device EU of FIG. 5A For example, the cross-section taken along the line III-III' of FIG. 7A may be substantially the same as the cross-section of the light emitting device EU of FIG. 5B. Therefore, repetitive explanation thereof will be omitted.

First, referring to FIG. 7A, the opening VO may penetrate the first insulating layer INS1 between the first and second electrodes ELT1 and ELT2 that are opposite each other and may partially expose opposing parts of the first and second electrodes ELT1 and ELT2.

The length W1 of the opening VO in the second direction DR2 may be substantially the same as the first length W1 described with reference to FIGS. 4-5B.

According to some embodiments, the length W3 of the opening VO in the first direction DR1 may be equal to or greater than the length W1 thereof in the second direction DR2. In this case, a plurality of light emitting elements LD may be mounted in the opening VO, and a larger number of light emitting elements LD may be disposed in the unit emission area. For example, as shown in FIG. 5A, seven light emitting elements LD may be disposed between the pair of first and second electrodes ELT1 and ELT2 along the length W2 of the opening VO (e.g., in FIG. 5A, seven light emitting elements LD may be disposed between the pair of first and second electrodes ELT1 and ELT2 along the first direction DR1). As shown in FIG. 7A, nine light emitting elements LD may be disposed between the pair of first and second electrodes ELT1 and ELT2 along the length W3 of the opening VO (e.g., in FIG. 7A, nine light emitting elements LD may be disposed between the pair of first and second electrodes ELT1 and ELT2 along the first direction DR1). That is, if necessary, the alignment uniformity of the light emitting elements LD may be slightly reduced, and the number of mounted light emitting elements LD may be further increased.

Referring to FIG. 7B, the opening VO may extend in the second direction DR2, and cross the first and second electrodes ELT1 and ELT2. In other words, the openings VO may extend relatively long in the second direction DR2 within the unit emission area, and may be repeatedly disposed along the first direction DR1. The line width of the first and second electrodes ELT1 and ELT2 may be relatively narrow, and the number of first and second electrodes ELT1 and ELT2 disposed in the limited unit emission area may be increased. Thus, the number of the light emitting elements LD disposed in the unit emission area may be increased.

As described above with reference to FIGS. 7A and 7B, the size of the opening VO of the first insulating layer INS1 may be changed in various ways.

Figure 8:
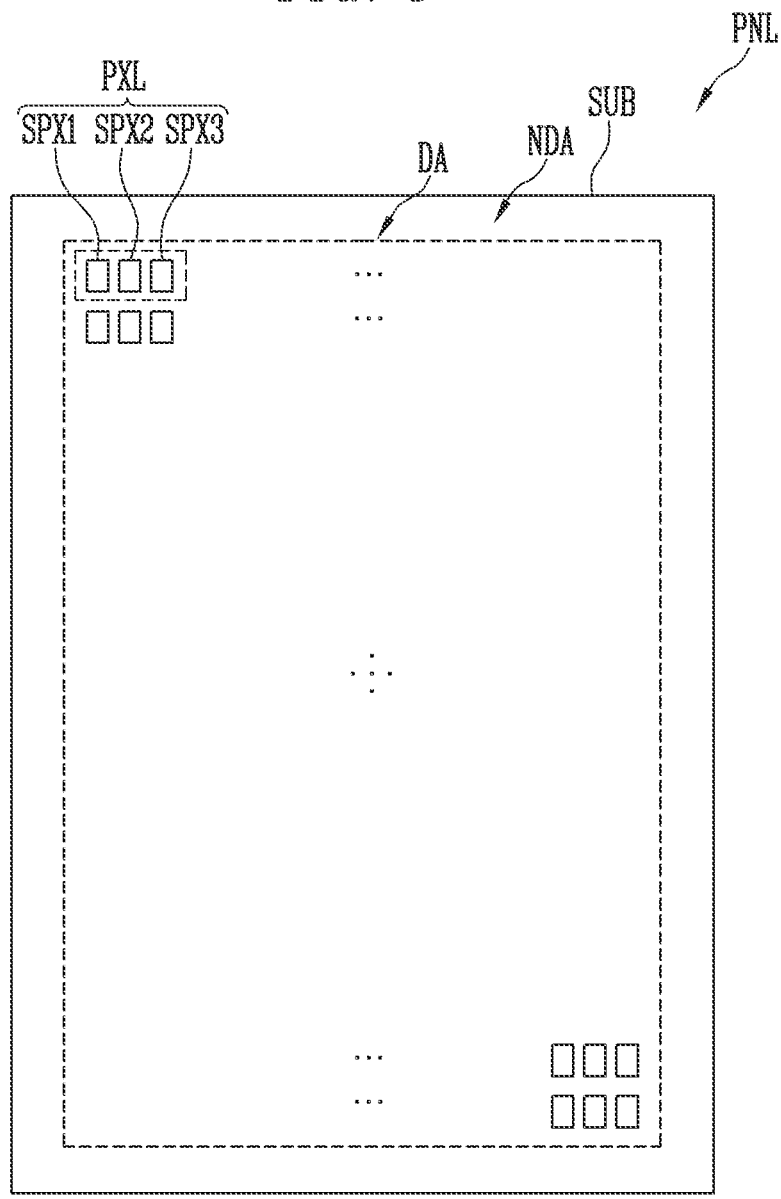
FIG. 8 is a plan view illustrating a display device in accordance with an embodiment of the present disclosure.

FIG. 8 is a plan view illustrating a display device in accordance with an embodiment of the present disclosure. In an embodiment, FIG. 8 illustrates a display device, for example, a display panel PNL provided in the display device, as an example of a device that may use, as a light source, the light emitting elements LD described with reference to FIGS. 1A-3B or the light emitting device EU described with reference to FIG. 4. In an embodiment, FIG. 8 illustrates the structure of the display panel PNL, focused on a display area DA. In some embodiments, although not illustrated, at least one driving circuit component (e.g., at least one of a scan driver and a data driver) and/or a plurality of lines may be further provided on the display panel PNL.

Referring to FIG. 8, the display panel PNL may include a substrate SUB and a pixel PXL disposed on the substrate SUB. In some embodiments, the display panel PNL and the substrate SUB may include a display area DA configured to display an image, and a non-display area NDA formed in an area (e.g., a set or predetermined area) other than the display area DA.

In an embodiment, the display area DA may be disposed in a central portion of the display panel PNL, and the non-display area NDA may be disposed along an edge or a perimeter of the display panel PNL in such a way as to enclose the display area DA. The locations of the display area DA and the non-display area NDA are not limited to this, and the locations thereof may be changed.

The substrate SUB may form a base member of the display panel PNL. For example, the substrate SUB may form a base member of a lower panel (e.g. lower plate of the display panel PNL). Because the substrate SUB is substantially the same as or similar to the substrate SUB described with reference to FIG. 4, repetitive description thereof will be omitted.

An area on the substrate SUB is defined as the display area DA in which the pixel PXL is disposed, and the other area thereof is defined as the non-display area NDA. For example, the substrate SUB may include the display area DA including a plurality of pixel areas on which the pixel PXL is formed, and the non-display area NDA disposed around the display area DA along the edge or periphery of the display area DA. Various lines and/or internal circuit units that are coupled to the pixels PXL of the display area DA may be disposed in the non-display area NDA.

The pixel PXL may include at least one light emitting element LD (e.g., at least one rod-type light emitting diode of any one of embodiments of FIGS. 1A-3B) that is driven by a corresponding scan signal and data signal. The plurality of rod-type light emitting diodes may form a light source of the pixel PXL.

Furthermore, the pixel PXL may include a plurality of sub-pixels. For example, the pixel PXL may include a first sub-pixel SPX1, a second sub-pixel SPX2, and a third sub-pixel SPX3. In an embodiment, the first, second, and third sub-pixels SPX1, SPX2, and SPX3 may emit light of different colors. For instance, the first sub-pixel SPX1 may be a red sub-pixel for emitting red light, the second sub-pixel SPX2 may be a green sub-pixel for emitting green light, and the third sub-pixel SPX3 may be a blue sub-pixel for emitting blue light. However, the colors, types and/or number of sub-pixels forming the pixel PXL are not particularly limited. For example, the color of light which is emitted from each sub-pixel may be changed in various ways. Although in FIG. 12 there is illustrated an embodiment where the pixels PXL are arranged in the display area DA in a stripe shape, the present disclosure is not limited thereto. For example, the pixels PXL may be arranged in various pixel arrangement forms that are currently known.

In an embodiment, the pixel PXL may be formed of an active pixel. However, the types, structures, and/or driving methods of the pixels PXL that may be applied to the display device according to the present disclosure are not particularly limited. For example, the pixel PXL may be formed of a pixel of a display device having various well-known passive or active structures.

Figure 9A:
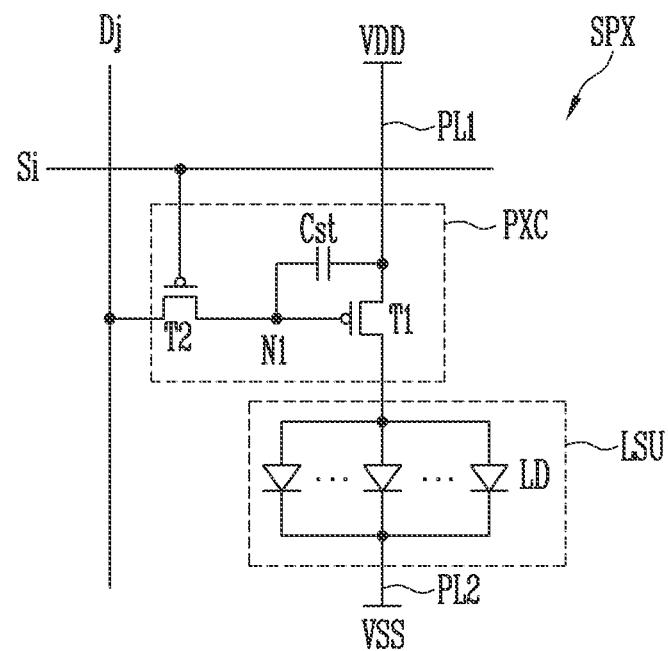
FIGS. 9A-9C are circuit diagrams illustrating an example of a pixel included in the display device of FIG. 8.
Figure 9B:
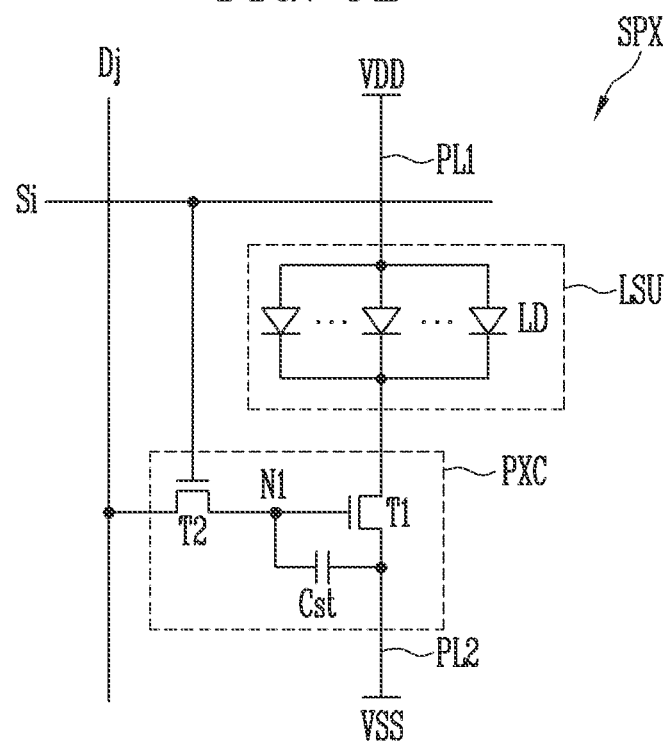
Figure 9C:
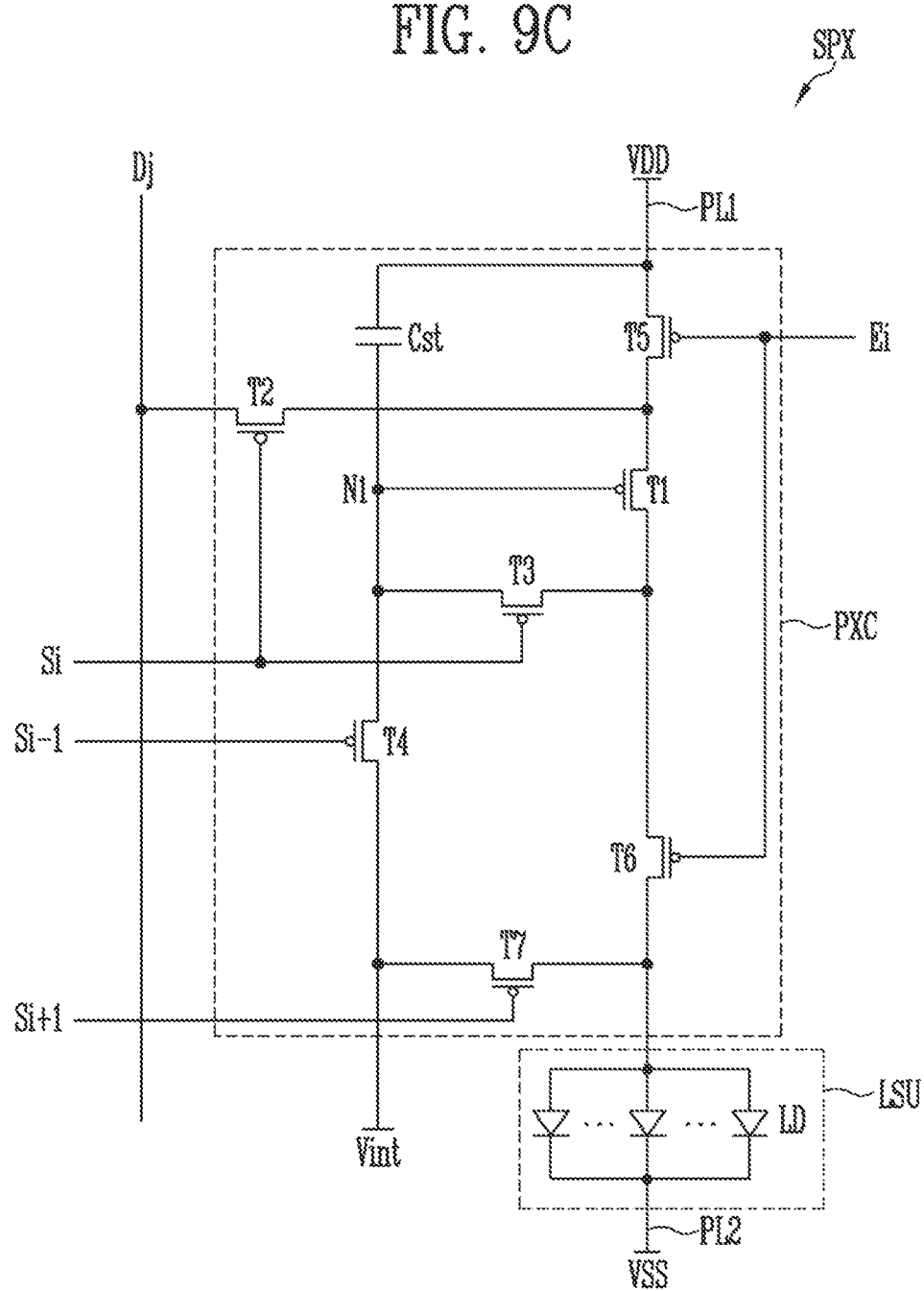

FIGS. 9A-9C are circuit diagrams illustrating an example of a sub-pixel included in the display device of FIG. 8. FIGS. 9A-9C illustrate any one of the first, second, and third sub-pixels SPX1, SPX2, and SPX3 of FIG. 8. FIGS. 9A-9C illustrate different embodiments of the sub-pixel SPX that may be provided in the active display device (e.g. an active light emitting display device).

For example, the sub-pixel SPX shown in FIGS. 9A-9C may be any one of the first, second, and third sub-pixels SPX1, SPX2, and SPX3 provided in the display panel PNL of FIG. 8. The structures of the first, second, and third sub-pixels SPX1, SPX2, and SPX3 may be substantially identical or similar to each other. Therefore, in FIGS. 9A-9C, the first, second, and third sub-pixels SPX1, SPX2, and SPX3 will be collectively referred to as "sub-pixel SPX".

First, referring to FIG. 9A, the sub-pixel SPX may include a light emitting unit LSU and a pixel circuit PXC for driving the light emitting unit LSU.

In an embodiment, the light emitting unit LSU may include a plurality of light emitting elements LD that are coupled parallel to each other between first and second power supplies VDD and VSS (or between a first power line PL1 and a second power line PL2 to which the first and second power supplies VDD and VSS are respectively applied). Here, the first and second power supplies VDD and VSS may have different potentials. For example, the first power supply VDD may be set as a high-potential power supply, and the second power supply VSS may be set as a low-potential power supply. Here, a difference in potential between the first and second power supplies VDD and VSS may be set to a threshold voltage of the light emitting elements LD or more during a light emitting period of the sub-pixel SPX.

Although FIGS. 9A-9C illustrates that the light emitting elements LD are coupled in parallel in the same direction (e.g., in a forward direction) between the first power supply VDD and the second power supply VSS, the present disclosure is not limited to this. For example, some of the light emitting elements LD may be coupled to each other in the forward direction between the first and second power supplies VDD and VSS, and the other ones of the light emitting elements LD may be coupled to each other in the reverse direction. As another example, at least one sub-pixel SPX may include only a single light emitting element LD.

According to an embodiment, the first end of each of the light emitting elements LD may be coupled in common to a corresponding pixel circuit PXC through a first electrode, and may be coupled to the first power supply VDD through the pixel circuit PXC and a first power line PL1. A second end of each of the light emitting elements LD may be coupled in common to the second power supply VSS through a second electrode and a second power line PL2.

The light emitting unit LSU may emit light having a luminance corresponding to driving current supplied thereto through the corresponding pixel circuit PXC. Thereby, an image (e.g., a set or predetermined image) may be displayed in the display area DA.

The pixel circuit PXC may be connected to a scan line Si and a data line Dj of the corresponding sub-pixel SPX. For example, if the sub-pixel SPX is disposed on an i-th row and a j-th column of the display area DA, the pixel circuit PXC of the sub-pixel SPX may be coupled to the i-th scan line Si and the j-th data line Dj of the display area DA. The pixel circuit PXC may include a first transistor T1, a second transistor T2, and a storage capacitor Cst.

The first transistor (or a driving transistor) T1 may be coupled between the first power supply VDD and the first electrode of the light emitting unit LSU. A gate electrode of the first transistor T1 is coupled to a first node N1. The first transistor T1 may control driving current to be supplied to the light emitting unit LSU in response to a voltage of the first node N1.

The second transistor (or switching transistor) T2 may be coupled between the data line Dj and the first node N1. A gate electrode of the second transistor T2 may be coupled to the scan line Si.

When a scan signal of a gate-on voltage (e.g., a low voltage) is supplied from the scan line Si, the second transistor T2 may be turned on to electrically couple the first node N1 to the data line Dj. During a frame period, a data signal of a corresponding frame may be supplied to the data line Dj, and the data signal may be transmitted to the first node N1 via the second transistor T2. Thereby, a voltage (or charge) corresponding to the data signal may be charged to the (or stored in) storage capacitor Cst.

The first electrode of the storage capacitor Cst may be coupled to the first power supply VDD, and the second electrode thereof may be coupled to the first node N1. The storage capacitor Cst may charge a voltage (or hold a charge) corresponding to a data signal supplied to the first node N1 during each frame period, and maintain the charged voltage until a data signal of a subsequent frame is supplied.

Although in FIG. 9A the transistors, e.g., the first and second transistors T1 and T2, included in the pixel circuit PXC have been illustrated as being formed of P-type transistors, the present disclosure is not limited to this. In other words, at least one of the first and second transistors T1 and T2 may be changed to an N-type transistor.

For example, as shown in FIG. 9B, both the first and second transistors T1 and T2 may be formed of N-type transistors. The configuration and operation of the sub-pixel SPX shown in FIG. 9B are substantially similar to those of the pixel circuit PXC of FIG. 9A, except that connection positions of some circuit elements are changed depending on a change in type of the transistors. Therefore, the description of the sub-pixel SPX of FIG. 9B will be omitted.

The structure of the pixel circuit PXC is not limited to the embodiments shown in FIGS. 9A and 9B. In other words, the pixel circuit PXC may be formed of a well-known pixel circuit which may have various structures and/or be operated by various driving schemes. For example, the pixel circuit PXC may be configured in the same manner as that of an embodiment illustrated in FIG. 9C.

Referring to FIG. 9C, the pixel circuit PXC may be connected not only to a scan line Si of a corresponding horizontal line but also to at least one another scan line (or a control line). For example, the pixel circuit PXC of the sub-pixel SPX disposed on the i-th row of the display area DA may be further connected to an i−1-th scan line Si−1 and/or an i+1-th scan line Si+1. In an embodiment, the pixel circuit PXC may be coupled not only to the first and second power supplies VDD and VSS but also to other power supplies. For instance, the pixel circuit PXC may also be coupled to an initialization power supply Vint. In an embodiment, the pixel circuit PXC may include first to seventh transistors T1 to T7 and a storage capacitor Cst.

The first transistor T1 may be connected between the first power supply VDD via the fifth transistor T5 and the first electrode of the light emitting unit LSU via the sixth transistor T6. A gate electrode of the first transistor T1 may be coupled to the first node N1. The first transistor T1 may control driving current supplied to the light emitting unit LSU in response to a voltage of the first node N1.

The second transistor T2 may be coupled between the data line Dj and the first electrode of the first transistor T1. The gate electrode of the second transistor T2 may be coupled to the corresponding scan line Si. When a scan signal of a gate-on voltage (e.g., a low voltage) is supplied from the scan line Si, the second transistor T2 may be turned on to electrically couple the data line Dj to the first electrode of the first transistor T1. Hence, if the second transistor T2 is turned on, a data signal supplied from the data line Dj may be transmitted to the first transistor T1.

The third transistor T3 may be coupled between the second electrode of the first transistor T1 and the first node N1. The gate electrode of the third transistor T3 may be coupled to the corresponding scan line Si. When a scan signal of a gate-on voltage (e.g., a low voltage) is supplied from the scan line Si, the third transistor T3 may be turned on to connect the first transistor T1 in the form of a diode (e.g., the first transistor T1 may be diode-connected).

The fourth transistor T4 may be coupled between the first node N1 and an initialization power supply Vint. A gate electrode of the fourth transistor T4 may be coupled to a preceding scan line, e.g. an i−1-th scan line Si−1. When a scan signal of a gate-on voltage (e.g., a low voltage) is supplied to the i−1-th scan line Si−1, the fourth transistor T4 may be turned on so that the voltage of the initialization power supply Vint may be transmitted to the first node N1. Here, the voltage of the initialization power supply Vint may be a minimum voltage of a data signal or less.

The fifth transistor T5 may be coupled between the first power supply VDD and the first electrode of the first transistor T1. A gate electrode of the fifth transistor T5 may be coupled to a corresponding emission control line, e.g., an i-th emission control line Ei. The fifth transistor T5 may be turned off when an emission control signal of a gate-off voltage (e.g., a high voltage) is supplied to the emission control line Ei, and may be turned on when an emission control signal of a gate-on voltage (e.g., a low voltage) is supplied to the emission control line Ei.

The sixth transistor T6 may be coupled between the second electrode of the first transistor T1 and the first electrode of the light emitting unit LSU. A gate electrode of the sixth transistor T6 may be coupled to a corresponding emission control line, e.g., an i-th emission control line Ei. The sixth transistor T6 may be turned off when an emission control signal of a gate-off voltage (e.g., a high voltage) is supplied to the emission control line Ei, and may be turned on when an emission control signal of a gate-on voltage (e.g., a low voltage) is supplied to the emission control line Ei.

The seventh transistor T7 may be connected between the first electrode of the light emitting unit LSU and the initialization power supply Vint. A gate electrode of the seventh transistor T7 may be coupled to any one of scan lines of a subsequent stage, e.g., to the i+1-th scan line Si+1. When a scan signal of a gate-on voltage is supplied to the i+1-th scan line Si+1, the seventh transistor T7 may be turned on so that the voltage of the initialization power supply Vint may be supplied to the first electrode of the light emitting unit LSU.

The storage capacitor Cst may be coupled between the first power supply VDD and the first node N1. The storage capacitor Cst may store a voltage (or hold a charge) corresponding both to the data signal applied to the first node N1 during each frame period and to the threshold voltage of the first transistor T1.

Although in FIG. 9C the transistors, e.g., the first to seventh transistors T1 to T7, included in the pixel circuit PXC have been illustrated as being formed of P-type transistors, the present disclosure is not limited to this. For example, at least one of the first to seventh transistors T1 to T7 may be changed to an N-type transistor. Furthermore, in this case, a voltage level of a control signal (e.g. a scan signal and/or a data signal) for controlling at least one of the first to seventh transistors T1 to T7 may be changed.

Furthermore, the structure of the sub-pixel SPX that may be applied to the present disclosure is not limited to the embodiments shown in FIGS. 9A-9C, and the sub-pixel SPX may have various well-known structures. For example, the pixel circuit PXC included in the sub-pixel SPX may be formed of a well-known pixel circuit which may have various structures and/or be operated by various driving methods. In another embodiment of the present disclosure, the sub-pixel SPX may be formed in a passive light emitting display device or the like. In this case, the pixel circuit PXC may be omitted, and each of the first and second electrodes of the light emitting unit LSU may be directly connected to the scan line Si, the data line Dj, a power line, and/or the control line.

FIG. 10 is a plan view illustrating an example of a sub-pixel included in the display device of FIG. 8. FIG. 10 illustrates the structure of the sub-pixel SPX, focused on the light-emitting element layer on which the light emitting elements LD of the sub-pixel SPX are disposed. The sub-pixel SPX may be formed in a sub-pixel area SPA defined on the substrate SUB.

Referring to FIGS. 5A and 10, the sub-pixel SPX of FIG. 10 may be substantially equal or similar to the light emitting device EU (or the pixel PXL) of FIG. 5A, except for the shape of the first and second electrodes ELT1 and ELT2 and the first and second openings VO1 and VO2. Therefore, repetitive explanation thereof will be omitted.

Figure 11:
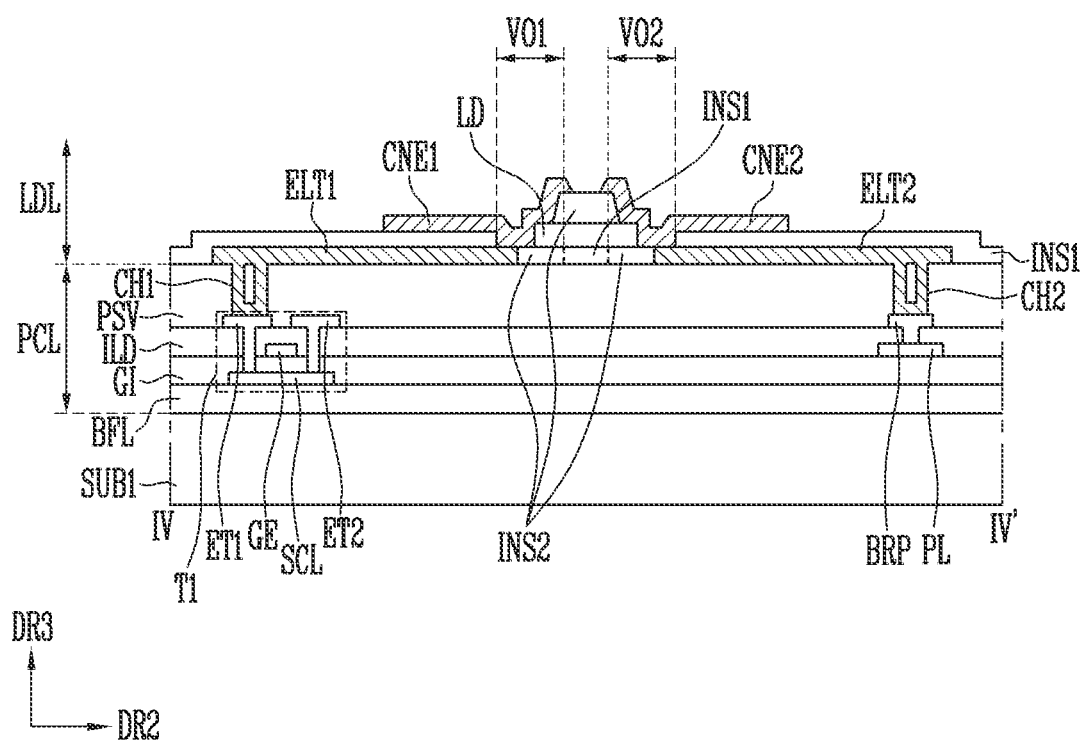
FIG. 11 is a sectional view illustrating an example of the sub-pixel of FIG. 10 taken along the line IV-IV of FIG. 10.

The light emitting device EU may include a substrate SUB, a first electrode ELT1, a second electrode ELT2, a first insulating layer INS1, light emitting elements LD, a first contact electrode CNE1, and a second contact electrode CNE2 (e.g., see, FIG. 11).

The first electrode ELT1 and the second electrode ELT2 may be disposed in the unit emission area to be spaced from each other, and may be disposed such that at least portions thereof face (or are oppose) each other.

The first electrode ELT1 may include two first sub-electrodes ELT_S1 and a first connection electrode CNL1. Each of the first sub-electrodes ELT_S1 may extend in the first direction DR1, and may be coupled to each other through the first connection electrode CNL1 extending in the second direction DR2.

The second electrode ELT2 may include one second sub-electrode ELT_S2 and a second connection electrode CNL2. The second sub-electrode ELT_S2 may extend in the first direction DR1, and may be coupled to the second connection electrode CNL2 extending in the second direction DR2. Furthermore, the second connection electrode CNL2 may extend to other sub-pixel areas (e.g. areas in which the first to third sub-pixels SPX1, SPX2, and SPX3 described with reference to FIG. 8 are disposed), so that the second sub-electrode ELT_S2 (or the second electrode ELT2) may be connected to the second sub-electrode (or the second electrode) of another sub-pixel area.

The first sub-electrode ELT_S1 and the second sub-electrode ELT_S2 may be alternately disposed along the second direction DR2 while having a suitable distance (e.g., a set or predetermined distance) therebetween. As described above, the first and second electrodes ELT1 and ELT2 shown in FIG. 10 are only for illustrative purpose, and the shape and/or mutual arrangement relationship of the first and second electrodes ELT1 and ELT2 may be changed in various ways.

In an embodiment, the first electrode ELT1 may be coupled to the pixel circuit PXC of the sub-pixel SPX, e.g., to the pixel circuit PXC shown in any one of FIGS. 9A-9C, through a first contact hole CH1. In an embodiment, the first contact hole CH1 may be disposed in a periphery of the emission area of each sub-pixel SPX.

In an embodiment, the pixel circuit PXC may be disposed under the light emitting elements LD disposed in the corresponding sub-pixel area SPA. For example, each pixel circuit PXC may be formed in a pixel circuit layer (or a circuit element layer including a circuit element such as a transistor) under the light emitting elements LD to be coupled to the first electrode ELT1 through the first contact hole CH1.

In an embodiment, the second electrode ELT2 may be coupled to the power supply (e.g. the second power supply VSS, see FIGS. 9A to 9C). For example, the second electrode ELT2 may be coupled to the second power supply VSS via the second contact hole CH2 and a power line coupled thereto. Similar to the first contact hole CH1, the second contact hole CH2 may be disposed in a periphery of the emission area of each sub-pixel SPX, but the present disclosure is not limited thereto.

In an embodiment, an area of the power line for supplying a voltage of the second power supply VSS may be disposed in the pixel circuit layer under the light emitting elements LD. For example, the power line may be disposed in the pixel circuit layer PCL (see FIG. 11) under the light emitting elements LD to be coupled to the second electrode ELT2 through the second contact hole CH2. However, the present disclosure is not limited thereto, and the position of the power line may be variously changed.

According to an embodiment, a separation distance between the first sub-electrode ELT_S1 and the second sub-electrode ELT_S2 (or a gap or a separation distance between the first electrode ELT1 and the second electrode ELT2) may be greater than the length L (see FIG. 1A) of each of the light emitting elements LD and/or an average length of the light emitting elements LD.

The first insulating layer INS1 may include a first opening VO1 (or a first slit or a first through hole) and a second opening VO2. Each of the first opening VO1 and the second opening VO2 may pass through the first insulating layer INS1. The first opening VO1 may partially expose a portion of the first electrode ELT1 facing (or is opposing) the second electrode ELT2, between the first and second electrodes ELT1 and ELT2 that are opposite each other. Likewise, the second opening VO2 may partially expose a portion of the second electrode ELT2 facing (or is opposing) the first electrode ELT1, between the first and second electrodes ELT1 and ELT2 that are opposing each other.

Each of the first and second openings VO1 and VO2 may have the shape of a rectangular plane, but the present disclosure is not limited thereto.

According to an embodiment, the first opening VO1 and the second opening VO2 may be spaced from each other by a first interval D1 in the second direction DR2 intersecting with the first direction DR1 in which the first and second electrodes ELT1 and ELT2 extend, or substantially perpendicular to the first direction DR1. The first interval D1 may be determined by a distance between the first and second electrodes ELT1 and ELT2, the average length of the light emitting elements LD, etc. For example, the first interval D1 may be smaller than the distance between the first and second electrodes ELT1 and ELT2, but may be 30% or more or 50% or more of the average length of the light emitting elements LD. In this case, a mounting space corresponding to the opening VO described with reference to FIG. 5A (i.e. a space in which the light emitting elements LD may be mounted) may be formed by the first and second openings VO1 and VO2, and the light emitting elements LD may be supported by the first insulating layer INS1 between the first and second openings VO1 and VO2.

According to an embodiment, the first openings VO1 may be repeatedly arranged along the first direction DR1 between the first and second electrodes ELT1 and ELT2, along one side of the first electrode ELT1, while having a second interval D2 therebetween. Similarly, the second openings VO2 may be repeatedly arranged along the first direction DR1 between the first and second electrodes ELT1 and ELT2, along one side of the second electrode ELT2, while having the second interval D2 therebetween. In this case, the second interval D2 is may be the same as the second interval D2 described with reference to FIG. 5A. For example, in one or more embodiments the second interval D2 may be smaller or larger than the average diameter of the light emitting elements LD.

In an embodiment, the sum of the length W1 of each of the first and second openings VO1 and VO2 in the second direction DR2 and the first interval D1 may be smaller than the average length of the light emitting elements LD. In this case, even if the light emitting elements LD are biased to one of the first and second openings VO1 and VO2, the first and second ends EP1 and EP2 of the light emitting elements LD are located in the first and second openings VO1 and VO2, so that they may be easily connected to the first and second contact electrodes CNE1 and CNE2, and a contact failure of the light emitting elements LD to the first and second electrodes ELT1 and ELT2 may be prevented.

The second length W2 in the minor-axis direction of each of the first and second openings VO1 and VO2 may be greater than the average diameter of the light-emitting elements LD by 10% to 100%, as described with reference to FIG. 5A.

The first and second contact electrodes CNE1 and CNE2 may be disposed on the first and second electrodes ELT1 and ELT2 and the first and second ends EP1 and EP2 of the light emitting elements LD. In an embodiment, the first and second contact electrodes CNE1 and CNE2 may be disposed at the same layer as illustrated in FIG. 11. In this case, the first and second contact electrodes CNE1 and CNE2 may be formed of the same conductive material in the same process, but the present disclosure is not limited thereto.

The first and second contact electrodes CNE1 and CNE2 may be substantially equal or similar to the first and second contact electrodes CNE1 and CNE2 described with reference to FIG. 6A.

As described with reference to FIG. 10, the first insulating layer INS1 includes a plurality of openings VO1 and VO2 exposing a portion of the first and second electrodes ELT1 and ELT2 between the pair of first and second electrodes ELT1 and ELT2. Therefore, even if the distance between the first and second electrodes ELT1 and ELT2 is longer than the average length of the light emitting elements LD, the light emitting elements LD are supported by the first insulating layer INS1 to be positioned above the first and second electrodes ELT1 and ELT2. Thus, light of the light emitting elements LD may be reflected by the first and second electrodes ELT1 and ELT2 to be emitted to the front surface.

Furthermore, because a space in which the light emitting elements LD may be mounted is formed by the first and second openings VO1 and VO2, the light emitting elements LD may be uniformly distributed.

FIG. 11 is a sectional view illustrating an example of the sub-pixel, taken along the line IV-IV of FIG. 10. FIG. 11 illustrates any one sub-pixel area SPA formed in the display panel PNL. The cross-sectional structures of the first, second, and third sub-pixels SPX1, SPX2, and SPX3 described with reference to FIG. 8 may be substantially identical or similar to each other. Therefore, for the convenience of explanation, FIG. 11 collectively illustrates the structures of the sub-pixels SPX1, SPX2, and SPX3 through the cross-section of the sub-pixel area SPA corresponding to the line IV-IV of FIG. 10.

Referring to FIGS. 10 and 11, the pixel circuit layer PCL and the light-emitting element layer LDL may be sequentially disposed in the sub-pixel area SPA on the substrate SUB. In an embodiment, the pixel circuit layer PCL and the light-emitting element layer LDL may be formed throughout the entire display area DA of the display panel PNL.

In an embodiment, the pixel circuit layer PCL may include a plurality of circuit elements disposed in the display area DA. For example, the pixel circuit layer PCL may include a plurality of circuit elements that are formed in the sub-pixel area SPA to form the pixel circuit PXC of the sub-pixel SPX. For instance, the pixel circuit layer PCL may include a plurality of transistors disposed in the sub-pixel area SPA, e.g., the first transistor T1 of FIGS. 9A and 9B. Although not illustrated in FIG. 11, the pixel circuit layer PCL may further include a storage capacitor Cst disposed in the sub-pixel area SPA, various signal lines (e.g., the scan line Si and the data line Dj illustrated in FIGS. 9A and 9B) coupled to the pixel circuit PXC, and various power lines (e.g., a first power line (not shown) and a second power line transmitting the first power VDD and the second power VSS, respectively) coupled to the pixel circuit PXC and/or the light emitting elements LD.

In an embodiment, the cross-sectional structures of a plurality of transistors, e.g., the first transistors T1, provided in the pixel circuit PXC, may be substantially identical or similar. However, the present disclosure is not limited thereto. In another embodiment, at least some of the plurality of transistors may have different types and/or structures.

In addition, the pixel circuit layer PCL includes a plurality of insulating layers. For example, the pixel circuit layer PCL may include a buffer layer BFL, a gate insulating layer GI, an interlayer insulating layer ILD, and a passivation layer PSV that are successively stacked on one surface of the substrate SUB.

In an embodiment, the buffer layer BFL may prevent impurities from diffusing into the circuit element. The buffer layer BFL may be formed of a single layer, or may be formed of multiple layers having at least two or more layers. In the case where the buffer layer BFL has the multilayer structure, the respective layers may be formed of the same material or different materials. In an embodiment, the buffer layer BFL may be omitted.

In an embodiment, the first transistor T1 may include a semiconductor layer SCL, a gate electrode GE, a first transistor electrode ET1, and a second transistor electrode ET2. Although FIG. 11 illustrates an embodiment in which the first transistor T1 includes the first transistor electrode ET1 and the second transistor electrode ET2 that are formed separately from the semiconductor layer SCL, the present disclosure is not limited thereto. For example, in another embodiment of the present disclosure, the first and/or second transistor electrode ET1 and/or ET2 provided in at least one transistor disposed in each sub-pixel area SPA may be integrally formed with the corresponding semiconductor layer SCL.

The semiconductor layer SCL may be disposed on the buffer layer BFL. For example, the semiconductor layer SCL may be disposed between the gate insulating layer GI and the substrate SUB on which the buffer layer BFL is formed. The semiconductor layer SCL may include a first area that comes into contact with a first transistor electrode ET1, a second area that comes into contact with a second transistor electrode ET2, and a channel area disposed between the first and second areas. In an embodiment, one of the first and second areas may be a source area, and the other one may be a drain area.

In an embodiment, the semiconductor layer SCL may be a semiconductor pattern formed of polysilicon, amorphous silicon, an oxide semiconductor, etc. The channel area of the semiconductor layer SCL may be an intrinsic semiconductor, which is an undoped semiconductor pattern. Each of the first and second areas of the semiconductor layer SCL may be a semiconductor pattern doped with a suitable impurity (e.g., a set or predetermined impurity).

The gate electrode GE may be disposed on the semiconductor layer SCL with the gate insulating layer GI interposed therebetween. For example, the gate electrode GE may be disposed between the gate insulating layer GI and the interlayer insulating layer ILD to overlap at least a portion of the semiconductor layer SCL in the third direction DR3.

The first and second transistor electrodes ET1 and ET2 may be disposed on the semiconductor layer SCL and the gate electrode GE with at least one interlayer insulating layer ILD and the gate insulating layer GI interposed therebetween. For example, the first and second transistor electrodes ET1 and ET2 may be disposed between the interlayer insulating layer ILD and the passivation layer PSV. The first and second transistor electrodes ET1 and ET2 may be electrically coupled to the semiconductor layer SCL. For example, the first and second transistor electrodes ET1 and ET2 may be respectively coupled to the first area and the second area of the semiconductor layer SCL through corresponding contact holes that pass through the gate insulating layer GI and the interlayer insulating layer ILD.

In an embodiment, any one of the first and second transistor electrodes ET1 and ET2 of at least one transistor (e.g., the first transistor T1 of FIGS. 9A and 9B) provided on the pixel circuit PXC may be electrically coupled, through the first contact hole CH1 passing through the passivation layer PSV, to the first electrode ELT1 of the light emitting unit LSU (or the light-emitting element layer LDL) disposed on the passivation layer PSV.

In an embodiment, at least one signal line and/or power line that is coupled to the sub-pixel SPX may be disposed on a layer identical with that of one electrode of each of the circuit elements that form the pixel circuit PXC. For example, the power line PL for supplying the second power supply VSS may be disposed on a layer identical with that of the gate electrodes GE of the first transistors T1, and electrically coupled to the second electrode ELT2 of the light emitting unit LSU (or the light-emitting element layer LDL) that is disposed on the passivation layer PSV, both through a bridge pattern BRP disposed on the same layer as that of the first and second transistor electrodes ET1 and ET2 and through at least one second contact hole CH2 passing through the passivation layer PSV. However, the structures and/or positions of the power line PL may be changed in various ways.

The light-emitting element layer LDL may include first and second electrodes ELT1 and ELT2, a first insulating layer INS1, light emitting elements LD, a second insulating layer INS2, and first and second contact electrodes CNE1 and CNE2, that are sequentially disposed and/or formed on the pixel circuit layer PCL.

The first and second electrodes ELT1 and ELT2 may be disposed on the pixel circuit layer PCL to be spaced from each other. The first and second electrodes ELT1 and ELT2 may be substantially identical or similar to the first and second electrodes ELT1 and ELT2 described with reference to FIGS. 4-5B, respectively.

The first insulating layer INS1 may be disposed on the first and second electrodes ELT1 and ELT2, and include first and second openings VO1 and VO2.

As described with reference to FIG. 10, the first opening VO1 may partially expose a portion of the first electrode ELT1 and the pixel circuit layer PCL. Similarly, the second opening VO2 may partially expose a portion of the second electrode ELT2 and the pixel circuit layer PCL.

As illustrated in FIG. 11, as the first opening VO1 and the second opening VO2 are formed in the first insulating layer INS1, a space in which the light emitting elements LD are mounted (i.e. a portion recessed downward between the first and second electrodes ELT1 and ELT2) may be formed. Furthermore, a portion of the first insulating layer INS1 between the first and second openings VO1 and VO2 may be directly disposed on the pixel circuit layer PCL, and may support the light emitting elements LD.

The second insulating layer INS2 may be disposed on the light emitting elements LD, for example, the light emitting elements LD aligned between the first and second electrodes ELT1 and ELT2, and may expose the first and second ends of the light emitting elements LD. For example, the second insulating layer INS2 may be partially disposed only on first areas of the light emitting elements LD without covering the first and second ends of the light emitting elements LD. The second insulating layer INS2 may be formed in an independent pattern on each sub-pixel area SPA; however, the present disclosure is not limited thereto. Furthermore, as illustrated in FIG. 11, an empty space defined by the first and second openings VO1 and VO2 at the same layer as the first and second electrodes ELT1 and ELT2 may be filled by the second insulating layer INS2. Consequently, the light emitting elements LD may be more reliably supported and fixed.

The first and second contact electrodes CNE1 and CNE2 may be disposed on the first and second electrodes ELT1 and ELT2 and the first and second ends of the light emitting elements LD. In an embodiment, the first and second contact electrodes CNE1 and CNE2 may be disposed at the same layer as illustrated in FIG. 11. In this case, the first and second contact electrodes CNE1 and CNE2 may be formed of the same conductive material in the same process, but the present disclosure is not limited thereto.

The first and second contact electrodes CNE1 and CNE2 may electrically connect the first and second ends of the light emitting elements LD to the first and second electrodes ELT1 and ELT2, respectively. For example, the first contact electrode CNE1 may cover first ends of the light emitting elements LD and a portion of the first electrode ELT1, and may be also filled in the first opening VO1 to connect the first ends of the light emitting elements LD to the first electrode ELT1. Similarly, the second contact electrode CNE2 may cover second ends of the light emitting elements LD and a portion of the second electrode ELT2, and may be also filled in the second opening VO2 to connect the second ends of the light emitting elements LD to the second electrode ELT2. Therefore, the contact failure with the first and second electrodes ELT1 and ELT2 of the light emitting elements LD may be prevented or reduced.

At least one overcoat layer may be further disposed on the first and second contact electrodes CNE1 and CNE2.

Figure 12:
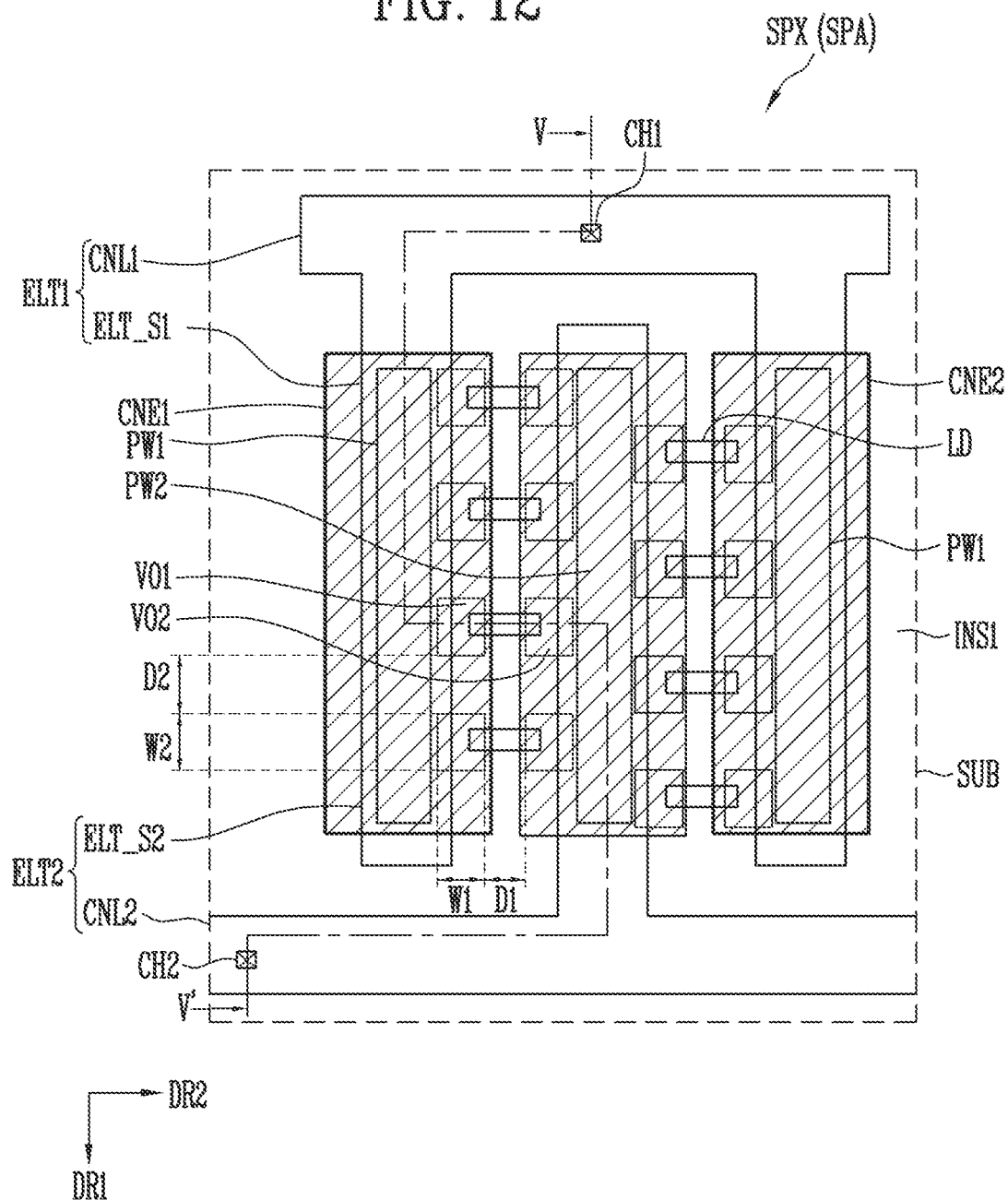
FIG. 12 is a plan view illustrating an example of a sub-pixel included in the display device of FIG. 8.

FIG. 12 is a plan view illustrating an example of a sub-pixel included in the display device of FIG. 8. FIG. 12 illustrates the structure of the sub-pixel SPX, focused on the light-emitting element layer on which the light emitting elements LD of the sub-pixel SPX are disposed.

Referring to FIGS. 10 and 12, the sub-pixel SPX of FIG. 12 may be substantially the same as or similar to the sub-pixel SPX of FIG. 10, except for bank patterns PW1 and PW2. Therefore, repetitive explanation thereof will be omitted.

The first bank pattern PW1 may be disposed under the first electrode ELT1 to overlap with an area of the first electrode ELT1. The second bank pattern PW2 may be disposed under the second electrode ELT2 to overlap with an area of the second electrode ELT2. The first and second bank patterns PW1 and PW2 may be disposed in the sub-pixel area SPA to be spaced from each other, and make areas of the first and second electrode ELT1 and ELT2 protrude upward. For example, the first electrode ELT1 may be disposed on the first bank pattern PW1, thus protruding in the height direction (or the thickness direction) of the substrate SUB by the first bank pattern PW1. The second electrode ELT2 may be disposed on the second bank pattern PW2, thus protruding in the height direction of the substrate SUB by the second bank pattern PW2.

In some embodiments, the first and second openings VO1 and VO2 of the first insulating layer INS1 may not overlap the first and second bank patterns PW1 and PW2. In other words, in a plan view, the first and second openings VO1 and VO2 of the first insulating layer INS1 may be formed between the first and second bank patterns PW1 and PW2. In this case, the mounting space (i.e. a space where the light emitting elements LD are mounted) formed by the first and second openings VO1 and VO2 may not be deformed by the first and second bank patterns PW1 and PW2, and the light emitting elements LD may be easily formed.

In an embodiment, the first and second openings VO1 and VO2 of the first insulating layer INS1 may be adjacent to the first and second bank patterns PW1 and PW2. For example, a side of the first opening VO1 may be adjacent to or in contact with the first bank pattern PW1, and a side of the second opening VO2 may be adjacent to or in contact with the second bank pattern PW2. In this case, the space where the light emitting elements LD are mounted may be defined by the first and second openings VO1 and VO2 and the first and second bank patterns PW1 and PW2. Due to the inclined surfaces of the first and second bank patterns PW1 and PW2, the light emitting elements LD may not be disposed on the first and second bank patterns PW1 and PW2, but may be more easily disposed in the mounting space.

Figure 13A:
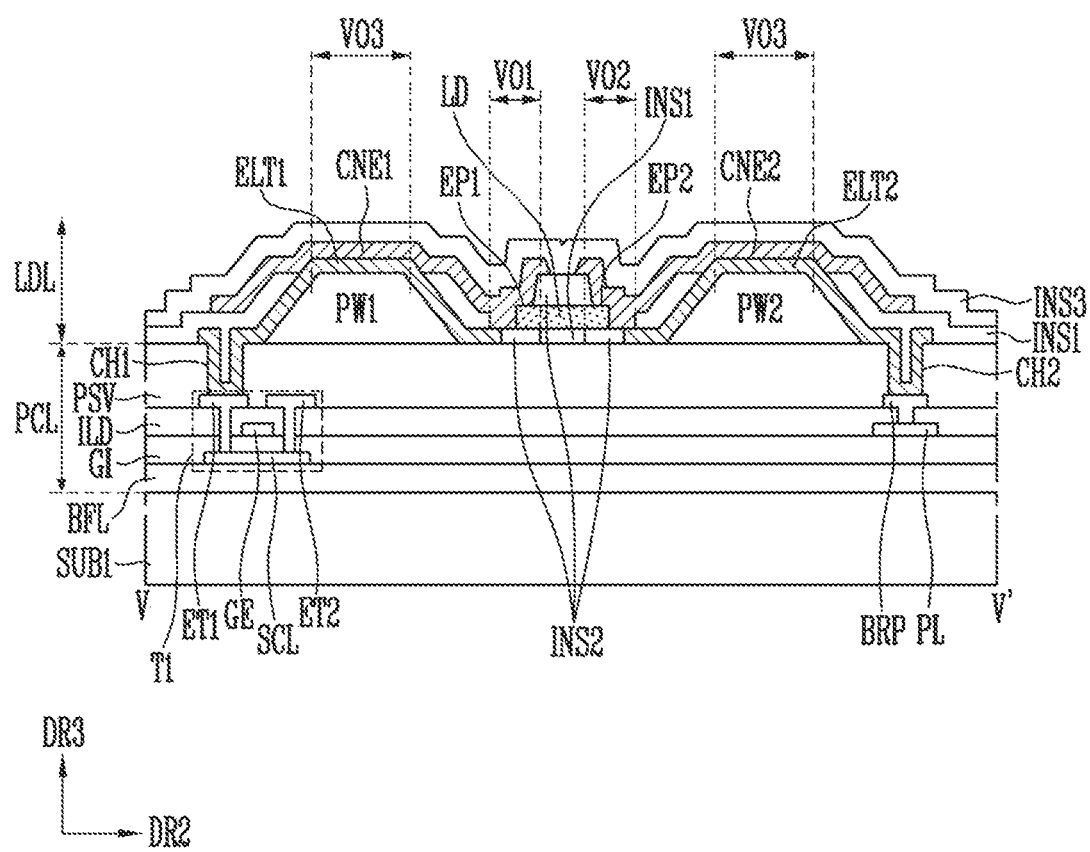
FIGS. 13A and 13B are sectional views illustrating another example of the sub-pixel of FIG. 12 taken along the line V-V of FIG. 12.
Figure 13B:
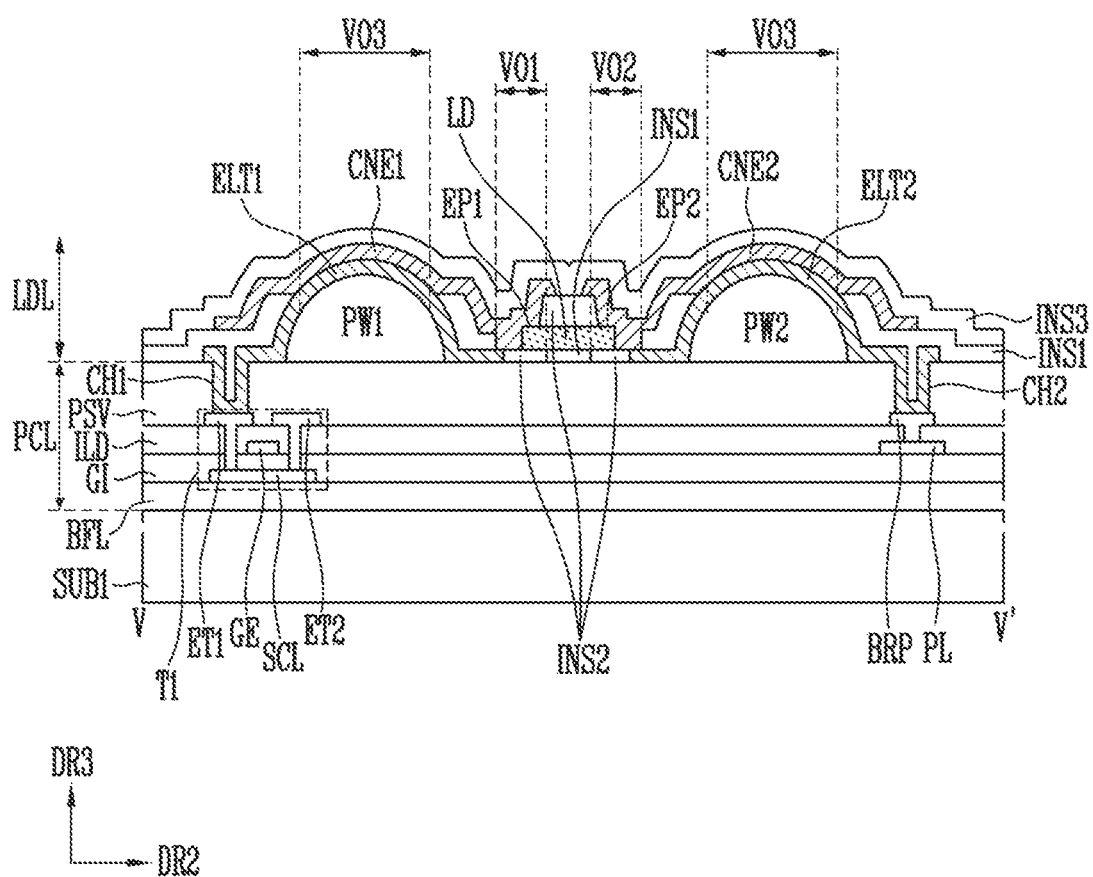

FIGS. 13A and 13B are sectional views illustrating an example of the sub-pixel, taken along the line V-V of FIG. 12. FIGS. 13A and 13B illustrate the cross-section of the sub-pixel corresponding to that of FIG. 11.

Referring to FIGS. 11, 12, 13A, and 13B, the pixel circuit layer PCL and the light-emitting element layer LDL may be sequentially disposed in the sub-pixel area SPA on the substrate SUB. In an embodiment, the pixel circuit layer PCL and the light-emitting element layer LDL may be formed throughout the entire display area DA of the display panel PNL.

Because the pixel circuit layer PCL illustrated in FIGS. 13A and 13B is substantially the same as or similar to the pixel circuit layer PCL described with reference to FIG. 11, repetitive explanation thereof will be omitted.

The light-emitting element layer LDL may include first and second bank patterns PW1 and PW2, first and second electrodes ELT1 and ELT2, a first insulating layer INS1, light emitting elements LD, a second insulating layer INS2, first and second contact electrodes CNE1 and CNE2, and a third insulating layer INS3, that are sequentially disposed and/or formed on the pixel circuit layer PCL.

The first and second bank patterns PW1 and PW2 may be disposed on the pixel circuit layer PCL. The first and second bank patterns PW1 and PW2 may be disposed in the emission area to be spaced from each other. The first and second bank patterns PW1 and PW2 may be disposed on the pixel circuit layer PCL to protrude in a height direction. In an embodiment, the first and second bank patterns PW1 and PW2 may have substantially the same height, but the present disclosure is not limited thereto.

In an embodiment, the first bank pattern PW1 may be disposed between the pixel circuit layer PCL and the first electrode ELT1. The first bank pattern PW1 may be disposed to be adjacent to the first ends EP1 of the light emitting elements LD. For instance, a side of the first bank pattern PW1 may be positioned at a distance adjacent to the first ends EP1 of the light emitting elements LD, and thereby may be disposed to face the first ends EP1.

In an embodiment, the second bank pattern PW2 may be disposed between the pixel circuit layer PCL and the second electrode ELT2. The second bank pattern PW2 may be disposed to be adjacent to the second ends EP2 of the light emitting elements LD. For instance, a side of the second bank pattern PW2 may be positioned at a distance adjacent to the second ends EP2 of the light emitting elements LD, and thereby may be disposed to face the second ends EP2.

In an embodiment, each of the first and second bank patterns PW1 and PW2 may have various shapes. By way of example, as illustrated in FIG. 13A, each of the first and second bank patterns PW1 and PW2 may have the cross-sectional shape of a trapezoid that is reduced in width from a bottom to a top thereof. In this case, each of the first and second bank patterns PW1 and PW2 may have an inclined surface on at least one side. As another example, as illustrated in FIG. 13B, each of the first and second bank patterns PW1 and PW2 may have the shape of a semi-circular or semi-elliptical cross-section, the width of which is gradually reduced upwards. In this case, each of the first and second bank patterns PW1 and PW2 may have a curved surface on at least one side.

In other words, the shape of each of the first and second bank patterns PW1 and PW2 may be changed in various ways rather than being particularly limited. Furthermore, in an embodiment, at least one of the first and second bank patterns PW1 and PW2 may be omitted or the position of each of the first and second bank patterns may be changed.

Each of the first and second bank patterns PW1 and PW2 may include insulating material having inorganic material and/or organic material. By way of example, the first and second bank patterns PW1 and PW2 may include at least one inorganic layer including various inorganic insulating materials that are well known to those skilled in the art, such as SiNx or SiOx. Alternatively, the first and second bank patterns PW1 and PW2 may include at least one organic layer and/or photo resist layer containing various known organic insulating materials, or may form a single or multi-layer insulator containing organic/inorganic materials in combination. In other words, the materials of the first and second bank patterns PW1 and PW2 may be variously changed.

In an embodiment, each of the first and second bank patterns PW1 and PW2 may function as a reflective member. For example, the first and second bank patterns PW1 and PW2, along with the first and second electrodes ELT1 and ELT2 provided on the first and second bank patterns, may function as reflective members that guide light emitted from each light emitting element LD in a desired direction, thus enhancing the light efficiency of the pixel PXL.

The first and second electrodes ELT1 and ELT2 may be disposed on the first and second bank patterns PW1 and PW2, respectively. The first and second electrodes ELT1 and ELT2 may be disposed in the sub-pixel area SPA to be spaced from each other.

In an embodiment, the first and second electrodes ELT1 and ELT2 disposed on the first and second bank patterns PW1 and PW2, respectively, may have shapes corresponding to the respective shapes of the first and second bank patterns PW1 and PW2. For example, the first and second electrodes ELT1 and ELT2 may protrude in the height direction (or the thickness direction) of the light-emitting element layer LDL while having inclined surfaces or curved surfaces corresponding to the first and second bank patterns PW1 and PW2, respectively.

Because the first and second electrodes ELT1 and ELT2 may be substantially the same as the first and second electrodes ELT1 and ELT2 described with reference to FIGS. 4-5B, respectively, repetitive explanation thereof will be omitted.

The first insulating layer INS1 may be disposed on one area of each of the first and second electrodes ELT1 and ELT2. For example, the first insulating layer INS1 may form to cover one area of each of the first and second electrodes ELT1 and ELT2, and may include an opening to expose another area of each of the first and second electrodes ELT1 and ELT2.

The first insulating layer INS1 may be disposed on the first and second electrodes ELT1 and ELT2, and include first and second openings VO1 and VO2.

As described with reference to FIG. 11, the first opening VO1 may partially expose a portion of the first electrode ELT1 and the pixel circuit layer PCL. Similarly, the second opening VO2 may partially expose a portion of the second electrode ELT2 and the pixel circuit layer PCL.

Furthermore, the first and second openings VO1 and VO2 may not overlap the first and second bank patterns PW1 and PW2. The light emitting elements LD may be guided into the mounting space (i.e. the space which is defined by the first and second openings VO1 and VO2 and in which the light emitting elements LD are mounted) along the inclined surfaces of the first and second bank patterns PW1 and PW2. Therefore, the number of the light emitting elements LD disposed between the first and second electrodes ELT1 and ELT2 to effectively emit light may be further increased.

A portion of the first insulating layer INS1 between the first and second openings VO1 and VO2 may be directly disposed on the pixel circuit layer PCL, and may support the light emitting elements LD.

The second insulating layer INS2 may be disposed on the light emitting elements LD, and may expose the first and second ends EP1 and EP2 of the light emitting elements LD. The second insulating layer INS2 may be substantially the same as the second insulating layer INS2 described with reference to FIG. 11.

The first and second contact electrodes CNE1 and CNE2 may be disposed on the first and second electrodes ELT1 and ELT2 and the first and second ends EP1 and EP2 of the light emitting elements LD, respectively.

The first and second contact electrodes CNE1 and CNE2 may electrically connect the first and second ends EP1 and EP2 of the light emitting elements LD to the first and second electrodes ELT1 and ELT2, respectively. The first contact electrode CNE1 may cover first ends EP1 of the light emitting elements LD and a portion of the first electrode ELT1, and may be also filled in the first opening VO1 to connect the first ends EP1 of the light emitting elements LD to the first electrode ELT1. Similarly, the second contact electrode CNE2 may cover second ends EP2 of the light emitting elements LD and a portion of the second electrode ELT2, and may be also filled in the second opening VO2 to connect the second ends EP2 of the light emitting elements LD to the second electrode ELT2.

According to an embodiment, the first insulating layer INS1 may further include a third opening VO3 exposing one area of the first and second electrodes ELT1 and ELT2 in an area overlapping the first and second bank patterns PW1 and PW2. The first and second contact electrodes CNE1 and CNE2 may come into contact with the first and second electrodes ELT1 and ELT2 through the third opening VO3.

As illustrated in FIG. 13A, the first electrode ELT1 on the flat upper surface of the first bank pattern PW1 may be exposed by the third opening VO3, and the first contact electrode CNE1 may be in direct contact with the first electrode ELT1 through the third opening VO3. Accordingly, the first ends EP1 of the light emitting elements LD and the first electrode ELT1 may be electrically connected more firmly. Similarly, the second electrode ELT2 on the flat upper surface of the second bank pattern PW2 may be exposed by the third opening VO3, and the second contact electrode CNE2 may be in direct contact with the second electrode ELT2 through the third opening VO3.

In some embodiments, the first and second openings VO1 and VO2 may be formed in the first insulating layer INS1 before the light emitting elements LD are supplied, and the third opening VO3 may be formed in the first insulating layer INS1 before or after the light emitting elements LD are supplied. When the third opening VO3 is formed before the light emitting elements LD are supplied, the size (e.g. the length in the major axis) of the third opening VO3 may be less than half of the average length of the light emitting elements LD. In this case, it is possible to prevent the light emitting elements LD from being disposed in the third opening VO3.

In an embodiment of the present disclosure, each sub-pixel SPX may form each light emitting device. For instance, the first sub-pixel SPX1 corresponding to the red sub-pixel may form a red light emitting device, the second sub-pixel SPX2 corresponding to the green sub-pixel may form a green light emitting device, and the third sub-pixel SPX3 corresponding to the blue sub-pixel may form a blue light emitting device Furthermore, a full-color pixel PXL including the first, second, and third sub-pixels SPX1, SPX2, and SPX3 may form a full-color light emitting device. In other words, the embodiments of the present disclosure are not necessarily limited to the display device, and the present disclosure may be widely applied to other types of devices requiring a light source.

While the spirit and scope of the present disclosure are described by detailed example embodiments, it should be noted that the above-described embodiments are merely descriptive and should not be considered limiting. It should be understood by those skilled in the art that various changes, substitutions, and alternations may be made herein without departing from the scope of the disclosure as defined by the following claims.

The scope of the present disclosure is not limited by detailed descriptions of the present disclosure, and should be defined by the accompanying claims. Furthermore, all changes or modifications of the present disclosure derived from the meanings and scope of the claims, and equivalents thereof should be construed as being included in the scope of the present disclosure.

What is claimed is:

1. A light emitting device, comprising:
a substrate;
a first electrode and a second electrode on the substrate and spaced from each other;
a first insulating layer on the substrate and the first and second electrodes, and including openings to partially expose opposing portions of the first and second electrodes adjacent an area between the first and second electrodes;
at least one light emitting element located in the opening; and
a second insulating layer disposed on the at least one light emitting element and fills the openings of the first insulating layer, the second insulating layer exposing both ends of the at least one light emitting element,
wherein a first end of the at least one light emitting element is connected to a first portion of the first electrode exposed by the opening, and
wherein a second end of the at least one light emitting element is connected to a second portion of the second electrode exposed by the opening.

2. The light emitting device according to claim 1, wherein the at least one light emitting element is a rod-type light emitting diode having a size ranging from a nanometer scale to a micrometer scale.

3. The light emitting device according to claim 2, wherein each of the openings is a rod-type slit having a size ranging from the nanometer scale to the micrometer scale.

4. The light emitting device according to claim 3, wherein a largest length of the opening is greater than an average length in a length direction of the at least one light emitting element by 5% to 30%.

5. The light emitting device according to claim 4, wherein a largest width of the opening is greater than an average diameter of the at least one light emitting element by 10% to 100%.

6. The light emitting device according to claim 3, wherein each of the first and second electrodes extends in a first direction, and
wherein the openings are repetitively arranged between the first and second electrodes and spaced from each other in the first direction.

7. The light emitting device according to claim 3, further comprising:
a first contact electrode overlapping the first end of the at least one light emitting element and the first electrode, and connecting the first end to the first electrode; and
a second contact electrode overlapping the second end of the at least one light emitting element and the second electrode, and connecting the second end to the second electrode.

8. The light emitting device according to claim 7, wherein the first electrode and the second electrode are located at a same layer, and wherein the first contact electrode and the second contact electrode are located at a same layer.

9. The light emitting device according to claim 3, wherein a distance between the first and second electrodes in the opening is smaller than an average length in a length direction of the at least one light emitting element,
wherein the first end of the at least one light emitting element overlaps the first electrode, and
wherein the second end of the at least one light emitting element overlaps the second electrode.

10. The light emitting device according to claim 3, wherein each of the first and second electrodes extends in a first direction, and
wherein a length of the opening in the first direction is smaller than an average length of the at least one light emitting element.

11. The light emitting device according to claim 3, wherein each of the first and second electrodes extends in a first direction,
wherein the opening extends in a second direction substantially perpendicular to the first direction, and
wherein the opening crosses the first and second electrodes.

12. A display device, comprising:
a substrate;
a first electrode and a second electrode on the substrate and spaced from each other;
a first insulating layer on the substrate and the first and second electrodes, and including a first opening that partially exposes a side of the first electrode, and a second opening that partially exposes a side of the second electrode that is opposite to the side of the first electrode;
at least one light emitting element between the first and second electrodes overlapping the first opening and the second opening; and
a second insulating layer disposed on the at least one light emitting element and fills the first and second openings of the first insulating layer, the second insulating layer exposing both ends of the at least one light emitting element,
wherein a first end of the at least one light emitting element is connected to a first portion of the first electrode exposed by the first opening, and
wherein a second end of the at least one light emitting element is connected to a second portion of the second electrode exposed by the second opening.

13. The display device according to claim 12, wherein the at least one light emitting element is a rod-type light emitting diode having a size ranging from a nanometer scale to a micrometer scale.

14. The display device according to claim 13, wherein each of the first and second openings is a slit having a size ranging from the nanometer scale to the micrometer scale.

15. The display device according to claim 14, wherein a distance between the sides of the first and second electrodes in the first and second openings is greater than an average length in a length direction of the at least one light emitting element, and
wherein the at least one light emitting element between the first and second electrodes is located on the first insulating layer.

16. The display device according to claim 15, wherein the at least one light emitting element is located in a space defined by the first and second openings.

17. The display device according to claim 14, wherein each of the first and second electrodes extends in a first direction, and
wherein a first length of each of the first and second openings in the first direction is greater than an average diameter of the at least one light emitting element by 10% to 100%.

18. The display device according to claim 17, wherein a second length of each of the first and second openings in a second direction is smaller than an average length in a length direction of the at least one light emitting element, and
wherein the second direction is substantially perpendicular to the first direction.

19. The display device according to claim 14, further comprising:
a first contact electrode overlapping the first end of the at least one light emitting element and the first electrode, and connecting the first end to the first electrode through the first opening; and
a second contact electrode overlapping the second end of the at least one light emitting element and the second electrode, and connecting the second end to the second electrode through the second opening.

20. The display device according to claim 12, further comprising:
a first partition wall between the substrate and the first electrode; and a second partition wall between the substrate and the second electrode.

* * * * *